(12) United States Patent
Kinzer

(10) Patent No.: US 9,613,891 B2
(45) Date of Patent: Apr. 4, 2017

(54) ELECTRONIC PACKAGES FOR FLIP CHIP DEVICES

(71) Applicant: NAVITAS SEMICONDUCTOR INC., El Segundo, CA (US)

(72) Inventor: Daniel M. Kinzer, El Segundo, CA (US)

(73) Assignee: Navitas Semiconductor, Inc., El Segundo, CA (US)

( * ) Notice: Subject to any disclaimer, the term of this patent is extended or adjusted under 35 U.S.C. 154(b) by 0 days.

(21) Appl. No.: 14/968,688

(22) Filed: Dec. 14, 2015

(65) Prior Publication Data

US 2016/0247748 A1  Aug. 25, 2016

Related U.S. Application Data

(60) Provisional application No. 62/120,177, filed on Feb. 24, 2015, provisional application No. 62/127,725, filed on Mar. 3, 2015, provisional application No. 62/154,589, filed on Apr. 29, 2015.

(51) Int. Cl.
| | |
|---|---|
| *H01L 23/495* | (2006.01) |
| *H01L 21/48* | (2006.01) |
| *H01L 23/31* | (2006.01) |
| *H01L 21/56* | (2006.01) |

(52) U.S. Cl.
CPC .... *H01L 23/49568* (2013.01); *H01L 21/4825* (2013.01); *H01L 21/4828* (2013.01); *H01L 21/4882* (2013.01); *H01L 23/3107* (2013.01); *H01L 23/3135* (2013.01); *H01L 23/49524* (2013.01); *H01L 23/49548* (2013.01); *H01L 23/49575* (2013.01); *H01L 23/49586* (2013.01); *H01L 21/56* (2013.01); *H01L 2224/16245* (2013.01); *H01L 2224/40245* (2013.01); *H01L 2224/73253* (2013.01); *H01L 2224/73255* (2013.01); *H01L 2924/18161* (2013.01)

(58) Field of Classification Search
None
See application file for complete search history.

(56) References Cited

U.S. PATENT DOCUMENTS

| | | | |
|---|---|---|---|
| 2016/0086881 A1* | 3/2016 | Standing | H01L 23/367 257/76 |
| 2016/0240471 A1* | 8/2016 | Klowak | H01L 23/4824 |
| 2016/0307826 A1* | 10/2016 | McKnight-MacNeil | H01L 24/83 |

* cited by examiner

*Primary Examiner* — Ali Naraghi
(74) *Attorney, Agent, or Firm* — Kilpatrick Townsend and Stockton, LLP

(57) ABSTRACT

Electronic packages are formed from a generally planar leadframe having a plurality of leads coupled to a GaN-based semiconductor device, and are encased in an encapsulant. The plurality of leads are interdigitated and are at different voltage potentials.

39 Claims, 15 Drawing Sheets

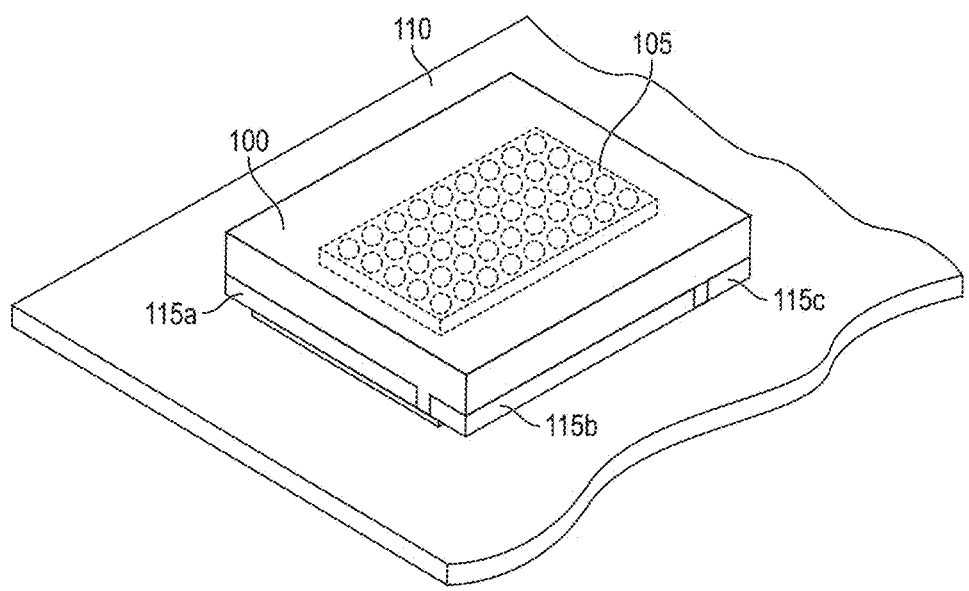
FIG. 1
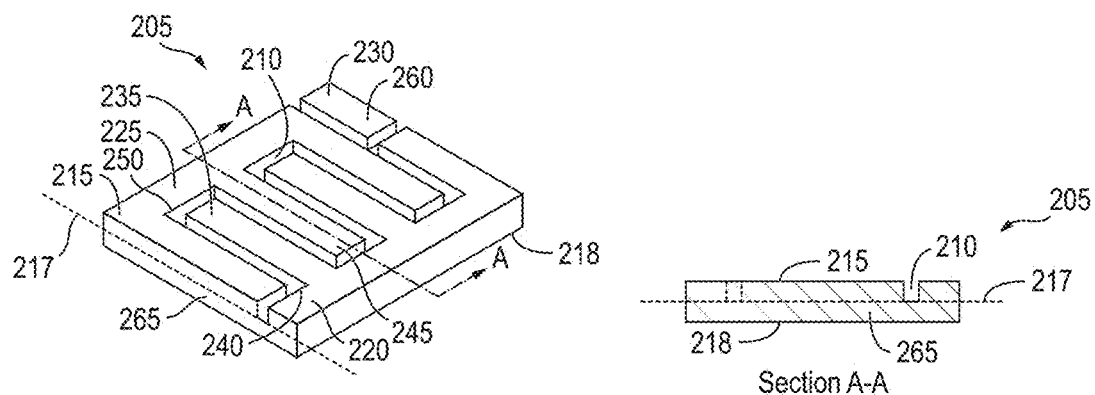
FIG. 2A
FIG. 2B
Section A-A
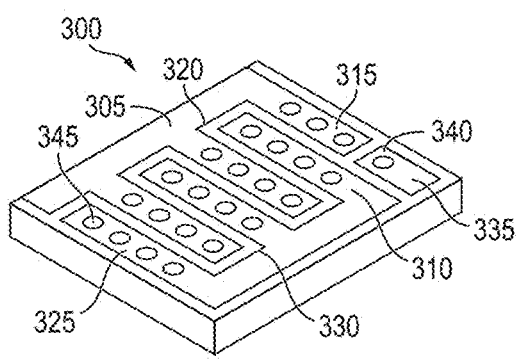
FIG. 3

Section B-B

Section C-C

Section D-D

Section F-F

Section G-G

Section H-H

ELECTRONIC PACKAGES FOR FLIP CHIP DEVICES

CROSS REFERENCE TO RELATED APPLICATIONS

This application claims priority to U.S. provisional patent applications Ser. No. 62/120,177 "ELECTRONIC PACKAGES FOR GAN DEVICES" filed on Feb. 24, 2015, Ser. No. 62/127,725, for "HALF BRIDGE POWER CONVERSION CIRCUITS USING GAN AND SILICON DEVICES" filed on Mar. 3, 2015 and to Ser. No. 62/154,589 for "LEADLESS HIGH SPEED HIGH VOLTAGE TRANSISTOR PACKAGE" filed on Apr. 29, 2015 which are hereby incorporated by reference in their entirety for all purposes.

FIELD

The present invention relates generally to electronic packages for semiconductor devices and in particular to electronic packages for one or more GaN-based semiconductor devices.

BACKGROUND

Electronic devices such as computers, servers and televisions, among others, employ numerous packaged semiconductor devices. Some semiconductor devices require specialized electronic packages to accommodate unique physical configurations and performance requirements. New electronic package designs and manufacturing techniques may be required to meet the needs of some semiconductor devices.

SUMMARY

Electronic packaging embodiments are disclosed that may be useful for semiconductor devices having closely spaced and interdigitated source and drain connections, such as GaN-based power devices. Further, these semiconductor devices may be configured to operate at high voltages, thus the internal spacing between the source and drain connections to the semiconductor device may be much less than the external spacing that is required between external package interconnects for creepage and clearance requirements. Thus, some electronic packaging embodiments disclosed have leadframes that are manufactured with structures that retain the tightly spaced semiconductor leads in place until the semiconductor is attached and encapsulated. In a subsequent process the retention structures are removed and the severed connections are passivated with a dielectric material.

In some embodiments an electronic package comprising a leadframe having a thickness extending from a top surface of the leadframe to a bottom surface of the leadframe is disclosed. The leadframe comprises a first terminal having a plurality of first terminal fingers extending therefrom and a second terminal having a plurality of second terminal fingers extending therefrom wherein the plurality of first terminal fingers are interdigitated with the plurality of second terminal fingers. The leadframe further comprises a third terminal having at least one third terminal finger, wherein the first terminal, the second terminal and the third terminal have a first thickness extending from the top surface of the leadframe to the bottom surface of the leadframe. The first terminal fingers, the second terminal fingers and the at least one third terminal finger have a second thickness extending from the top surface of the leadframe to an intermediate plane that is located between the top surface and the bottom surface of the leadframe. A GaN-based die is electrically coupled to the top surface of the leadframe, and includes a source pad having a plurality of source fingers and a drain pad having a plurality of drain fingers. The plurality of source fingers are interdigitated with the plurality of drain fingers, and a gate pad. A plurality of interconnects are disposed between the GaN-based die and the top surface of the leadframe and are configured to provide electrical continuity between the plurality of first terminal fingers and the plurality of drain fingers, between the plurality of second terminal fingers and the plurality of source fingers and between the third terminal finger and the at least one gate pad, respectively. A first encapsulant is adhered to the leadframe such that it encapsulates the GaN-based die. The first encapsulant has a thickness that extends from at least the intermediate plane to at least a top surface of the GaN-based die. One or more channels are formed in the bottom surface of the leadframe to a depth of at least the intermediate plane and a second encapsulant is disposed within the one or more channels.

In some embodiments there are two channels formed in the bottom surface of the leadframe. In further embodiments portions of the first encapsulant extend to the bottom surface of the leadframe. In yet further embodiments the first terminal is an elongated bar and the plurality of first terminal fingers are attached along a length of the bar and extend outward away from the first terminal in a direction of the second terminal.

In some embodiments an exposed portion of the first terminal is separated from an exposed portion of the second terminal by a distance of at least 1 millimeter. In further embodiments a heat spreader is attached to a top surface of the GaN-based die. In other embodiments the heat spreader extends to a top surface of the electronic package.

In some embodiments a strap is secured to a top surface of the GaN-based die and to the top surface of the leadframe. In further embodiments the leadframe has a thickness that is between 50 microns and 250 microns thick. In other embodiments a length of the first and the second terminal fingers is greater than a pitch between each of the first terminal fingers and each of the second terminal fingers.

In some embodiments a method of forming an electronic package comprises providing a metallic leadframe having a thickness extending from a top surface of the leadframe to a bottom surface of the leadframe. A first patter is selectively formed in the top surface of the leadframe to an intermediate plane having a depth of approximately one half the thickness of the leadframe. A second pattern is selectively formed in a second pattern in the bottom surface of the leadframe to a depth of the intermediate plane. A semiconductor device is provided, having a plurality of pads. The semiconductor device is mounted to the top surface of the leadframe using a plurality of electrical interconnects. A first encapsulant is formed around the semiconductor device and within the first and the second patterns. At least one channel is formed in the bottom surface of the leadframe to a depth of at least the intermediate plane and a second encapsulant is disposed within the at least one channel.

In some embodiments the second encapsulant is the same material as the first encapsulant. In further embodiments the at least one channel is formed by chemically etching the leadframe material. In other embodiments the first encapsulant functions as at least one edge of an etching mask.

In some embodiments the at least one channel is formed by sawing the leadframe material. In further embodiments a heat spreader is attached to a top surface of the GaN-based die before forming the first encapsulant. In yet further embodiments a strap is secured to a top surface of the GaN-based die and to the top surface of the leadframe before forming the first encapsulant.

In some embodiments a method of forming an electronic package comprises providing a metallic leadframe having a thickness extending from a top surface of the leadframe to a bottom surface of the leadframe. A first pattern is selectively formed in the top surface of the leadframe to an intermediate plane having a depth of approximately one half the thickness of the leadframe. A semiconductor device is provided having a plurality of pads. The semiconductor device is mounted to the top surface of the leadframe using a plurality of electrical interconnects. A first encapsulant is formed around the semiconductor device and within the first pattern. At least a portion of the bottom surface of the leadframe is removed to a depth of at least the intermediate plane. A dielectric material is disposed on a bottom surface of the electronic package.

In some embodiments the removing at least a portion of the bottom surface of the leadframe comprises forming one or more channels in the bottom surface of the leadframe. In further embodiments disposing a dielectric material on a bottom surface of the leadframe comprises disposing an encapsulant material within the one or more channels. In other embodiments the removing at least a portion of the bottom surface of the leadframe comprises removing an entire bottom portion of the leadframe to the intermediate plane.

In some embodiments the dielectric material comprises a dielectric layer disposed on a portion of a bottom surface of the electronic package such that the dielectric layer at least partially defining one or more electronic package interconnects. In further embodiments a heat spreader is attached to a top surface of the GaN-based die before forming the first encapsulant. In some embodiments the heat spreader extends to a top surface of the electronic package. In further embodiments a strap is secured to a top surface of the GaN-based die and to the top surface of the leadframe before forming the first encapsulant.

In some embodiments an electronic package comprises a leadframe including a first terminal having a plurality of first terminal fingers extending therefrom and a second terminal having a plurality of second terminal fingers extending therefrom wherein the plurality of first terminal fingers are interdigitated with the plurality of second terminal fingers, and a third terminal having at least one third terminal finger. A GaN-based semiconductor device is electrically coupled to a top surface of the leadframe and includes a source pad having a plurality of source fingers and a drain pad having a plurality of drain fingers wherein the plurality of source fingers are interdigitated with the plurality of drain fingers, and a gate pad having at least one gate finger. A plurality of interconnects are disposed between the GaN-based die and the leadframe and configured to provide electrical continuity between the plurality of first terminal fingers and the plurality of drain fingers, between the plurality of second terminal fingers and the plurality of source fingers and between the third terminal finger and the at least one gate finger, respectively. A dielectric layer is disposed on a portion of a bottom surface of the electronic package at least partially defining one or more electronic package interconnects. An encapsulant layer is adhered to the leadframe and encapsulates the GaN-based die. The encapsulant layer has a thickness that extends from at least a top surface of the leadframe to at least a top surface of the GaN-based die.

In some embodiments the dielectric layer is a soldermask material. In further embodiments the first terminal is an elongated bar and the plurality of first terminal fingers are attached along a length of the bar and extend outward away from the first terminal in a direction of the second terminal. In other embodiments the second terminal is an elongated bar and the plurality of second terminal fingers are attached along a length of the bar and extend outward away from the second terminal in a direction of the first terminal. In yet other embodiments the dielectric encapsulant extends to the bottom surface of the electronic package and is disposed within gaps between the plurality of first terminal fingers, the plurality of second terminal fingers and the third terminal finger.

In some embodiments the dielectric layer has a thickness between 50 microns and 150 microns. In further embodiments the leadframe has a thickness that is between 50 microns and 250 microns thick. In other embodiments the plurality of interconnects comprise solder. In yet other embodiments the plurality of interconnects comprise copper-based structures secured to the top surface of the leadframe with a solder material.

In some embodiments the plurality of first terminal fingers and the plurality of the second terminal fingers have a pitch that is 800 microns or less. In further embodiments the plurality of first terminal fingers and the plurality of the second terminal fingers have a length that is 1 millimeter or greater.

In some embodiments a method of forming an electronic package comprises providing a metallic leadframe having a thickness extending between a top surface of the leadframe and a bottom surface of the leadframe. A first pattern is selectively etched in the top surface of the leadframe to a depth of an intermediate plane disposed between the top surface and the bottom surface of the leadframe. A semiconductor device having a plurality of pads is provided. The plurality of the pads of the semiconductor device are mounted to the top surface of the leadframe using a plurality of electrical interconnects. The semiconductor device and the top surface of the leadframe are encapsulated with an encapsulant. A bottom portion of the leadframe is removed to the intermediate plane. A dielectric layer is disposed on a bottom surface of the electronic package.

In some embodiments removal of the bottom portion of the leadframe is performed with a chemical etching process. In further embodiments the encapsulant is disposed within the first pattern to a depth of the intermediate plane.

To better understand the nature and advantages of the present invention, reference should be made to the following description and the accompanying figures. It is to be understood, however, that each of the figures is provided for the purpose of illustration only and is not intended as a definition of the limits of the scope of the present invention. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIG. 1 is a simplified illustration of an electronic package for a GaN-based device mounted to a printed circuit board according to an embodiment of the invention;

FIGS. 2A-2B are simplified illustrations of a leadframe that may be employed in the electronic package illustrated in FIG. 1;

FIG. 3 is a simplified illustration of a GaN-based semiconductor device that may be used in the electronic package illustrated in FIG. 1;

DETAILED DESCRIPTION

Figure 4A:
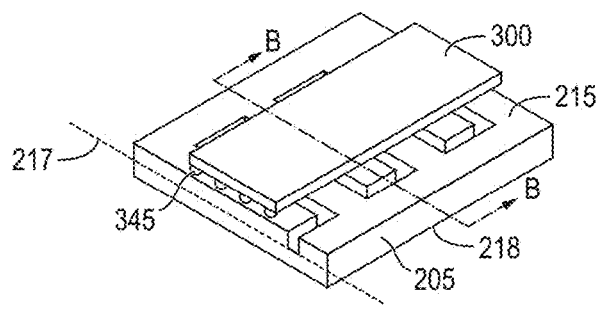
FIGS. 4A-4B are simplified illustrations of the semiconductor device illustrated in FIGS. 4A-4B attached to the leadframe illustrated in FIGS. 2A-2B.

Certain embodiments of the present invention relate to electronic packaging for semiconductor devices. While the present invention can be useful for a wide variety electronic packages, some embodiments of the invention are particularly useful for electronic packages for GaN-based semiconductors for use in power conversion circuits as described in more detail below.

For example, in some embodiments a GaN-based semiconductor device may be configured to operate at voltages greater than 200 Volts and have interdigitated source and drain leads that are approximately 1 millimeter apart. The external spacing between external terminals depends on the voltage rating and the environment of the circuit. The internal spacing between source and drain connections to the chip may be much less than the external spacing for optimum chip performance. The GaN-based semiconductor may benefit from an electronic package that has internal power connections that are very closely spaced, but external terminals that meet high voltage creepage and clearance requirements while providing environmental protection for the semiconductor device. In further embodiments the electronic package may have relatively high aspect ratio interdigitated source and drain leads that may benefit from support structures that remain in place during manufacturing processes but are removed to create high voltage creepage and clearance for the completed electronic package, as discussed in more detail below.

In order to better appreciate the features and aspects of electronic packages for GaN-based devices according to the present invention, further context for the invention is provided in the following section by discussing one particular implementation of electronic packaging for GaN-based devices according to embodiments of the present invention. These embodiments are for example only and other embodiments may be employed for other devices such as multiple GaN-based devices in a single electronic package, a combination of GaN and Si devices in a single package or electronic packages that include other types of devices such as, but not limited to silicon, indium phosphide, gallium nitride or silicon carbide.

FIG. 1 depicts an illustrative rendering of an electronic package 100 that includes an encapsulated GaN-based semiconductor device 105. Electronic package 100 is attached to a printed circuit board 110 using one or more leads 115a, 115b, 115c and protects semiconductor device 105 from the environment while providing electrical interconnectivity between the semiconductor device and the printed circuit board. Electronic package 100 and the methods of manufacturing some embodiments will be shown in greater detail below.

Now referring to FIGS. 2A-7C, this series of illustrations show one embodiment of electronic package 100 during selected sequential steps of manufacturing. FIG. 8 is an associated method 800 of manufacturing for this embodiment and will be referred to simultaneously.

Now referring to FIG. 2A (step 805 of FIG. 8) a metallic leadframe 205 is provided. In some embodiments leadframe 205 may comprise copper while in other embodiments other types of metals may be used, including alloys. In further embodiments leadframe 205 may be a part of a larger leadframe that may be subsequently singulated into multiple electronic packages 100, as discussed in more detail below. In one embodiment leadframe 205 may be between 50 microns and 250 microns thick. In further embodiments leadframe 205 may be between 100 and 200 microns thick while in another embodiment it may be approximately 150 microns thick.

Continuing to refer to FIG. 2A and advancing to step 810 of FIG. 8, a first pattern 210 may be formed in a top surface 215 of leadframe 205 to a depth of an intermediate plane 217. Intermediate plane 217 may be located approximately at a midpoint between top surface 215 and bottom surface 218 of leadframe 205, however in further embodiments the intermediate plane may be located at any point between the top surface and the bottom surface of the leadframe. The location of intermediate plane 217 and the depth of first pattern 210 is shown with more clarity in FIG. 2B which shows cross-section A-A through leadframe 205 in FIG. 2A.

First pattern 210 may be formed by one or more processes including, but not limited to, chemical etching, machining, laser ablating or cutting. In the embodiment shown in FIGS. 2A and 2B, first pattern 210 is generally serpentine in shape and at least partially defines a first terminal 220, a second terminal 225 and a third terminal 230. In some embodiments first terminal 220 and second terminal 225 may be generally shaped as elongated bars, each having a plurality of fingers attached along a length of either bar and extending outwardly. More specifically, in one embodiment, first terminal 220 may have a plurality of first terminal fingers 235 disposed along edge 240 that extend outward, away from the first terminal and in a direction towards second terminal 225.

Similarly, second terminal 225 may have a plurality of second terminal fingers 245 disposed along edge 250 that extend outward, away from the second terminal and in a direction towards first terminal 220. In further embodiments, plurality of first terminal fingers 235 may be interdigitated with plurality of second terminal fingers 245 such that the fingers are arranged in an alternating pattern. In some embodiments a pitch of the alternating pattern (i.e., from a center of one finger to a center of an adjacent finger) may be 400 microns or less. In yet further embodiments third terminal 230 may have at least one third terminal finger 260. In other embodiments leadframe 205 may have additional terminals and terminal fingers as illustrated in more detail below. Other variations and configurations of leadframe 205 are within the scope of this disclosure.

In some embodiments plurality of first and second terminal fingers 235, 245, respectively, may have a length greater than 0.5 millimeters while in another embodiment the length may be greater than 1 millimeter. In further embodiments the length of first and second terminal fingers 235, 245, respectively may be between 1 millimeter and 5 millimeters. In other embodiments the length of first and second terminal fingers 235, 245, respectively may be between 1.5 millimeters and 3 millimeters. In yet further embodiments a width of plurality of first and second terminal fingers 235, 245, respectively, may be between 0.1 millimeters and 0.5 millimeters. In further embodiments the width of first and second terminal fingers 235, 245, respectively may be between 0.2 millimeters and 0.4 millimeters and in one embodiment may be 0.25 millimeters. In further embodiments a spacing between adjacent plurality of first and second terminal fingers 235, 245, respectively, may be between 0.05 millimeters and 0.4 millimeters while in other embodiments it may be between 0.1 millimeters and 0.2 millimeters. In one embodiment the spacing between first and second terminal fingers 235, 245, respectively may be approximately 0.150 millimeters. In some embodiments a length of the first and the second terminal fingers 235, 245, respectively is greater than a pitch between each of the first terminal fingers and each of the second terminal fingers. More specifically, in such embodiments the distance "pitch" from a particular first terminal finger 235 to the adjacent second terminal finger 245 shall be less than the length of the first and the second terminal fingers 235, 245, respectively. In some embodiments the ratio of length to pitch may be greater than one while in other embodiments it may be greater than 2 and in some embodiments may be greater than 3.

In some embodiments, limiting an etching depth of first pattern 210 in top surface 215 of leadframe 205 to approximately one half the thickness of the leadframe may assist with achieving high manufacturing yields of the leadframe. More specifically, in some embodiments it may be difficult to form first and second terminal fingers 235, 245, respectively having a length greater than 1 millimeter if first pattern 210 was formed all the way through the thickness of leadframe 205. Such a process would result in cantilevered fingers having a length greater than 1 millimeter with no support other than the terminal they are attached to. Fingers with such a high aspect ratio may be easily damaged by handling and processing, or may simply bow and deflect due to residual stresses within the leadframe material. However, by only etching first pattern 210 to a depth of approximately one half the thickness of leadframe 205, a bottom portion 265 (shown in FIG. 2B) of the leadframe that is adjacent bottom surface 218 is left in a substantially solid condition providing support along the entire length of the fingers. This configuration may not only improve yields during the formation (e.g., etching) of first pattern 210 but may also improve yields during die attach, cleaning and molding processes discussed in more detail below.

Now referring to FIG. 3 (step 815 of FIG. 8) a semiconductor device 300 is provided. As discussed above, in some embodiments semiconductor device 300 may be a GaN-based device. Other features of embodiments of GaN-based device 300 are discussed in more detail below. In further embodiments semiconductor device 300 may have a source pad 305 and a drain pad 310 that may be generally shaped as elongated pads, each having a plurality of fingers attached along a length of either pad and extending outwardly. More specifically, in one embodiment, source pad 305 may have a plurality of source fingers 315 disposed along edge 320 that extend outward, away from the source pad and in a direction towards drain pad 310.

Similarly, drain pad 310 may have a plurality of drain fingers 325 disposed along edge 330 that extend outward, away from the drain pad and in a direction towards source pad 305. In further embodiments, plurality of source fingers 315 may be interdigitated with plurality of drain fingers 325 such that the fingers are arranged in an alternating pattern. In yet further embodiments semiconductor device 300 may have a gate pad 335 having at least one gate finger 340. In other embodiments semiconductor device 300 may have additional pads and pad fingers as illustrated in some embodiments below. Other variations and configurations of semiconductor device 300, including the use of multiple devices within a single electronic package are within the scope of this disclosure. In further embodiments, semiconductor device 300 may have a plurality of interconnects 345, as discussed in more detail below.

Figure 4B:
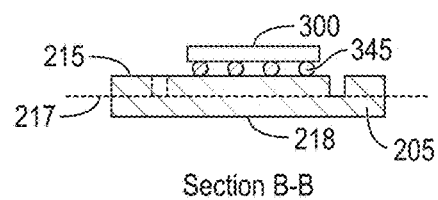

Now referring to FIG. 4A (step 820, FIG. 8) semiconductor device 300 is mounted to top surface 215 of leadframe 205 with plurality of interconnects 345. FIG. 4B shows section B-B from FIG. 4A which is a cross-section through a selected portion of leadframe 205 and semiconductor device 300. Plurality of interconnects 345 may be disposed between semiconductor device 300 and leadframe 205 and configured to provide electrical continuity between the semiconductor device and portions of the leadframe. More specifically, in one embodiment semiconductor device 300 is aligned on leadframe 205 such that plurality of source fingers 315 (see FIG. 3) align with plurality of first terminal fingers 235 (see FIG. 2A), plurality of drain fingers 325 (see FIG. 3) align with plurality of second terminal fingers 245 (see FIG. 2A) and at least one gate finger 340 (see FIG. 3) aligns with at least one third terminal finger 260 (see FIG. 2A) and plurality of interconnects 345 provide electrical continuity therebetween, respectively. Although plurality of interconnects 345 are illustrated as generally spherical structures, it is understood the plurality of interconnects may be any shape including, but not limited to cylindrical, square, hemispherical, hexagonal or any other shape.

In further embodiments plurality of interconnects 345 may comprise one or more solder materials known in the art. In some embodiments solder materials such as, but not limited to combinations of tin and lead, tin, silver and copper, tin and antimony, tin and silver, gold and silicon, pure tin and tin and bismuth may be used. In further embodiments plurality of interconnects 345 may comprise metallic structures such as columns or balls made out of a metal such as, but not limited to copper or steel. The metallic structures may then be attached to leadframe 205 with one or more solder materials as discussed above. Other methods of attaching semiconductor device 300 to leadframe 205 may be used such as electrically conductive epoxy, and are within the scope of this disclosure. After attachment of semiconductor device 300, the assembly may be cleaned using processes known in the art, or may not be cleaned for embodiments using for example, a no-clean soldering process.

Figure 5A:
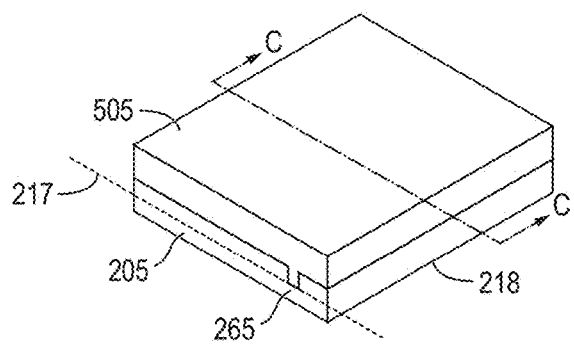
FIGS. 5A-5B are simplified illustrations of the electronic package illustrated in FIGS. 4A-4B after encapsulation.
Figure 5B:
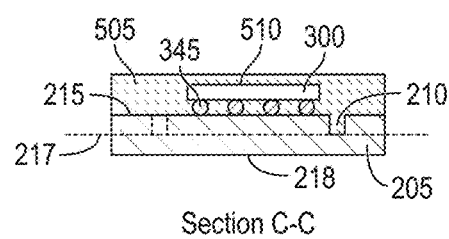

Now referring to FIG. 5A (step 825 in FIG. 8) semiconductor device 300 and top surface 215 of leadframe 205 are encapsulated with an encapsulant material 505 forming a partially assembled electronic package. FIG. 5B shows section C-C from FIG. 5A which is a cross-section through a selected portion of leadframe 205, semiconductor device 300 and encapsulant material 505. Encapsulant material 505 has a thickness that extends from top surface 215 of leadframe 205 to at least top surface 510 of semiconductor device 300 such that the active areas of the semiconductor device may be protected from the environment. In some embodiments encapsulant material 505 may extend into recesses in leadframe 205 such as first pattern 210 (see FIG. 2A). That is, in some embodiments encapsulant material 505 may completely fill in first pattern 210 (see FIG. 2A) to intermediate plane 217, including regions between plurality of interconnects 345, creating a substantially solid electronic package with few or no air voids.

In some embodiments encapsulant material 505 may be a dielectric polymer-based material and may have one or more solid fillers such as, but not limited to silica, aluminum-oxide or aluminum nitride. In further embodiments the polymer may be a thermosetting epoxy, polyimide or polyurethane. In other embodiments the polymer may be a thermoplastic material such as, but not limited to polyphenylene sulfide or liquid crystal polymer. In some embodiments encapsulant material 505 may be disposed on leadframe 205 with a transfer molding process, as discussed in more detail below.

Figure 6A:
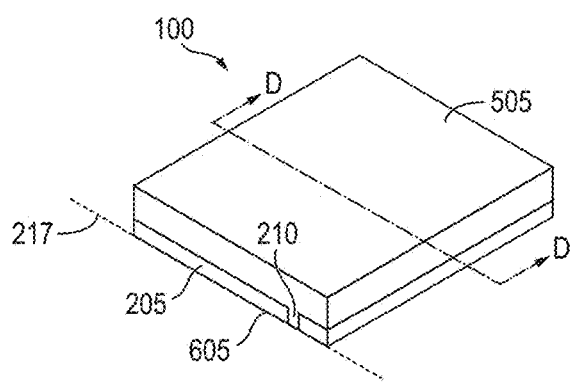
FIGS. 6A-6B are simplified illustrations of the electronic package illustrated in FIGS. 5A-5B after a bottom portion of the leadframe has been removed.
Figure 6B:
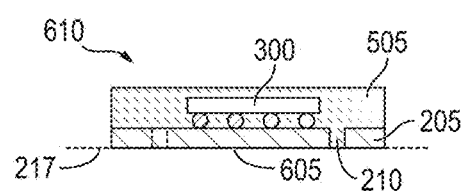

Now referring to FIG. 6A (step 830 in FIG. 8) electronic package 100 is shown after a bottom portion 265 (see FIG. 2A) of leadframe 205 has been removed from electronic package 100. More specifically, bottom surface 218 (see FIG. 2A) of leadframe 205 may be removed to a depth of intermediate plane 217 which in some embodiments may be approximately one half the thickness of the leadframe. In some embodiments bottom surface 218 (see FIG. 2A) of leadframe 205 may be removed to a depth of a bottom of first pattern 210 (i.e., to intermediate plane 217) such that a portion of encapsulant 505 within first pattern 210 is now disposed on what is a newly created bottom surface 605 (shown in FIG. 6A) of electronic package 100. FIG. 6B shows section D-D from FIG. 6A which is a cross-section through a selected portion of leadframe 205, semiconductor device 300 and encapsulant 505.

To remove bottom portion 265 (see FIG. 2A) of leadframe 205, in some embodiments, a partially assembled electronic package 100, as illustrated in FIG. 5A, may be immersed in a chemical etchant until the bottom portion of the leadframe is removed. In such embodiments, encapsulant 505 may be impervious and unaffected by etchant such that it protects semiconductor device 300 and portions of leadframe 205 from the etchant. In other embodiments bottom portion 265 (see FIG. 2A) of leadframe 205 may be removed with a different method such as, but not limited to machining, ablation or cutting. The removal of the bottom portion 265 (see FIG. 2A) of leadframe 205 may be to a sufficient depth to electrically isolate first terminal 220 (see FIG. 2) and first terminal fingers 235, second terminal 225 and second terminal fingers 245 and third terminal 230 and at least one third terminal finger 260 from each other, as illustrated in greater detail below.

Figure 7A:
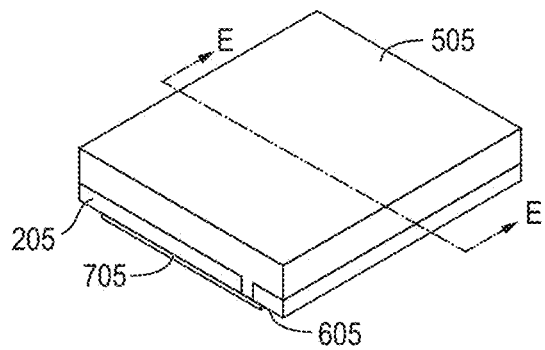
FIGS. 7A-7C are simplified illustrations of the electronic package illustrated in FIGS. 6A-6B after a dielectric layer has been added to a bottom surface of the electronic package.
Figure 7B:
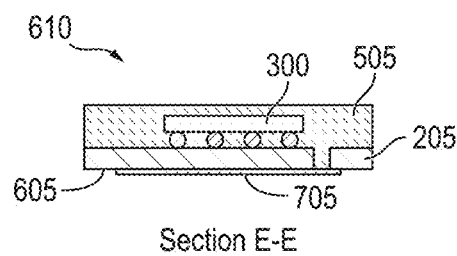
Figure 7C:
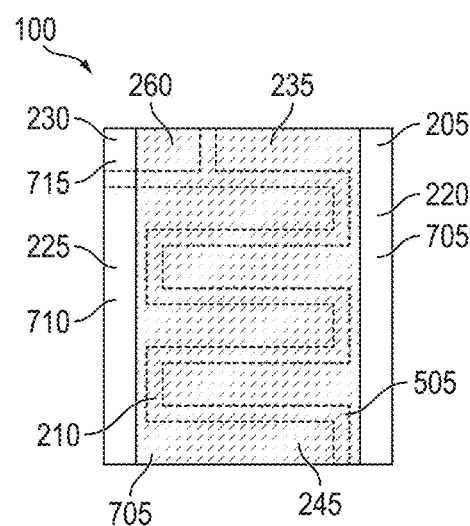
Figure 8:
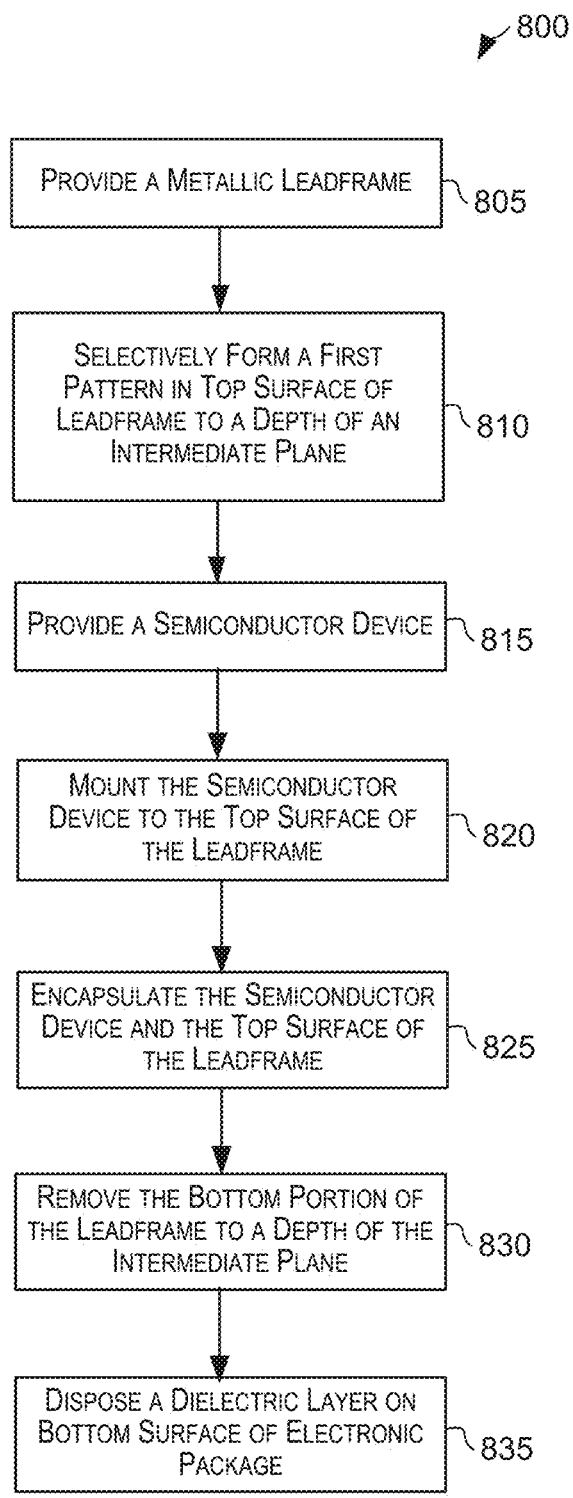
FIG. 8 is method of manufacturing the electronic package illustrated in FIGS. 1-7C.

Now referring to FIGS. 7A-7C (step 835 in FIG. 8) a dielectric layer 705 is disposed on new bottom surface 605 of electronic package 100. FIG. 7B shows section E-E from FIG. 7A which is a cross-section through a selected portion of leadframe 205, semiconductor device 300 and encapsulant 505. FIG. 7C shows a bottom view of electronic package 100 illustrated in FIG. 7A. Dielectric layer 705 may be applied over portions of plurality of first terminal fingers 235, plurality of second terminal fingers 245 and at least one third terminal finger 260 to create an increased dielectric withstanding voltage between the fingers. More specifically, dielectric layer 705 may be applied over portions of first terminal fingers 235, plurality of second terminal fingers 245 and at least one third terminal finger 260 such that the fingers are completely isolated by dielectric materials (i.e., encapsulant 505 and dielectric layer 705) to increase the dielectric withstanding voltage between adjacent fingers. In further embodiments, dielectric layer 705 may also cover a portion of first terminal 220, second terminal 225 and third terminal 230, defining first lead 705, second lead 710 and third lead 715 for electronic package 100.

In some embodiments dielectric layer 705 may be a solder mask material such as, but not limited to, a polymer, epoxy or other material that is capable of adhering to both leadframe 205 and encapsulant 505. In further embodiments dielectric layer 705 may be photoimagable to make one or more openings in the dielectric layer that may be used for electrical leads. In some embodiments dielectric layer 705 may be between 5 microns and 250 microns thick while in other embodiments it may be between 25 microns and 200 microns thick. In further embodiments it may be between 50 microns and 150 microns thick while in one embodiment it may be approximately 125 microns thick.

In some embodiments first lead 705, second lead 710 and third lead 715 may have one or more layers of plating that may be applied before dielectric layer 705 or after patterning the dielectric layer. In further embodiments the plating on first lead 705, second lead 710 and third lead 715 may include, but shall not be limited to, layers of nickel, gold, tin, silver and/or alloys including solder alloys.

In some embodiments GaN-based semiconductor device 300 (see FIG. 4A) may be a transistor configured to operate at voltages in the range of 100 Volts to 1200 Volts and in further embodiments operate in the range of 200 Volts to 800 Volts and in one embodiment operate at approximately 400 Volts to 600 Volts. In some embodiments GaN-based semiconductor device 300 may be capable of switching in the 10's of Megahertz and in some embodiments in the 100's of Megahertz. In further embodiments the specific resistance of GaN-based semiconductor device 300 in milliohm-cm2 may be approximately 2 for a 600 Volt capable device, while in other embodiments it may be between 0.5 and 10. In some embodiments a lead pitch (e.g., from the center of one lead to the center of an adjacent lead) between adjacent source and drain fingers on GaN-based semiconductor device 300 may be approximately 0.5 millimeter while in further embodiments it may be between 0.2 and 2.0 millimeters. In yet further embodiments GaN-based device 300 may be an integrated device having a power transistor along with one or more control circuits such as a transistor driver circuit and/or a controller circuit. In other embodiments, GaN-based device 300 may have two power transistors (e.g, a high side and a low side transistor in a half-bridge power conversion circuit), a driver circuit for each power transistor and a control circuit for controlling the driver circuits. Further, it is within the scope of this disclosure that any electronic package disclosed herein may accommodate more than one GaN device and/or other circuit elements. The modification of any electronic packages disclosed herein to accommodate such variations is within the scope of this disclosure, such as adding interconnects to accommodate increased input/output interconnects and adding areas for multiple devices and/or to accommodate larger devices.

In some embodiments the electronic packages described herein may be useful to maximize the die size to package size ratio. For example, in one embodiment the GaN die within the electronic package may have dimensions of 4 millimeters wide by 5 millimeters long and the electronic package footprint may be 5 millimeters wide by 6 millimeters long. Thus the ratio of die area to package area for this example would be 20:30 or 0.667. In another embodiment the GaN die may have dimensions of 4.5 millimeters by 5.5 millimeters yielding a ratio of 24.8:30 or 0.825. Further embodiments may have different ratios. As the die size to package size ratio increases the electronic performance characteristics of the package also typically increase due to shorter and more efficient interconnects. For example, in a traditional electronic package (quad-flat no lead "QFN") the electronic package may contribute approximately 100 milliohms of resistance and 0.5 nanohenries of inductance. However, the electronic packages disclosed herein typically contribute only approximately 40 milliohms of resistance and 0.1 nanohenries of inductance. Further, as the die to electronic package ratio increases the space consumed on the primary circuit board decreases and overall packaging efficiency may be increased.

Now referring to FIGS. 9-15 another embodiment of an electronic package 900 is illustrated that includes an encapsulated GaN-based semiconductor device. Electronic package 900 may also be attached to a printed circuit board 110 (see FIG. 1) and may be similar to electronic package 100, however this embodiment does not have a solder mask material on the bottom surface. Instead, the terminals that are used for connection to the printed circuit board are partially defined with a second encapsulant, which may also be used to provide a relatively high dielectric withstanding voltage between the terminal fingers, as discussed in more detail below. Electronic package 900 and the methods of manufacturing some embodiments will be shown in greater detail below.

Now referring to FIGS. 9-15, an illustrated sequence of steps for manufacturing an embodiment of electronic package 900 is shown. FIG. 16 is an associated method of manufacturing 1600 for this embodiment and will be referred to simultaneously.

Figure 9:
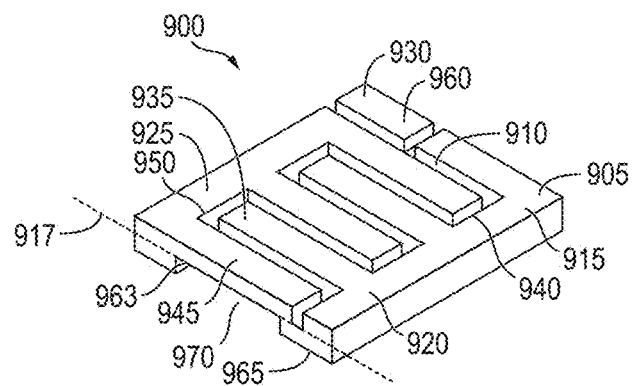
FIG. 9 is simplified illustration of a leadframe for an electronic package according to an embodiment of the invention.

Now referring to FIG. 9 (step 1605 of FIG. 16) a metallic leadframe 905 is provided. In some embodiments leadframe 905 may be similar to leadframe 205 illustrated in FIG. 2, and may be made from the same material having the same range thickness.

Continuing to refer to FIG. 9 and advancing to step 1610 of FIG. 16, a first pattern 910 may be selectively formed in a top surface 915 of leadframe 905 to an intermediate plane 917. Intermediate plane 917 may be disposed at any location between top surface 915 and bottom surface 965 of leadframe 905, however in one embodiment the intermediate plane is positioned at approximately the midpoint between the top surface and the bottom surface of the leadframe.

In this embodiment first pattern 910 is generally serpentine in shape and at least partially defines a first terminal 920, a second terminal 925 and a third terminal 930. In some embodiments first terminal 920 and second terminal 925 may be generally shaped as elongated bars, each having a plurality of fingers attached along a length of either bar and extending outwardly. More specifically, in one embodiment, first terminal 920 may have a plurality of first terminal fingers 935 disposed along edge 940 that extend outward, away from the first terminal and in a direction towards second terminal 925.

Similarly, second terminal 925 may have a plurality of second terminal fingers 945 disposed along edge 950 that extend outward, away from the second terminal and in a direction towards first terminal 920. In further embodiments, plurality of first terminal fingers 935 may be interdigitated with plurality of second terminal fingers 945 such that the fingers are arranged in an alternating pattern. Third terminal 930 may have at least one third terminal finger 960. In other embodiments leadframe 905 may have additional terminals and terminal fingers as illustrated in some embodiments below. Other variations and configurations of leadframe 905 are within the scope of this disclosure.

Advancing to step 1615 of FIG. 16 a second pattern 963 may be selectively formed in a bottom surface 965 of leadframe 905 to a depth of intermediate plane 917. In some embodiments second pattern 963 may form one or more longitudinal channels 970 in bottom surface 965. In one embodiment a single longitudinal channel 970 may be formed between first terminal 920 and second terminal 925, such that a thickness of plurality of first terminal fingers 935, plurality of second terminal fingers 945 and at least one third terminal finger 960 are reduced to a thickness of approximately one half the thickness of leadframe 905 (i.e., to intermediate plane 917).

In further embodiments, a width of longitudinal channel 970 may be narrow enough to leave distal tips of plurality of first terminal fingers 935 attached to second terminal 925 and distal tips of plurality of second terminal fingers 945 attached to first terminal 920. In some embodiments this may enable improved manufacturing yields for leadframe 905 since the distal tips of the relatively high aspect ratio fingers remain attached to the opposite terminal. This structure may keep the distal tips secure from moving due to residual stresses within the leadframe material and from externally applied forces. Thus, such a configuration may improve yields not only during the formation of leadframe 905, but may also improve yields during subsequent die attachment, cleaning and molding processes described in more detail below.

In some embodiments first pattern 910 and second pattern 963 may be formed in different processes while in other embodiments they may be formed with the same process. First and second patterns, 910, 963, respectively, may be formed with similar techniques as discussed above with regard to leadframe 210 in FIG. 2A. Further, in some embodiments when first pattern and second pattern 910, 963 respectively are formed in leadframe 205, one or more terminals and/or fingers such as third terminal 930 and at least one third terminal finger 960 may not have a distal tip attached to the opposite terminal. In such embodiments, the unsupported terminals and/or fingers may be supported by a portion of a leadframe "frame" disposed adjacent to the finger and attached to the finger with one or more tie bars, discussed in more detail below. The one or more tie bars may be formed as a temporary structure to hold the unsupported terminal and/or finger in place during processing and may be removed during singulation of electronic package 900 from a leadframe "frame" that may hold other electronic packages. Other methods known in the art to support leadframe structures may also be used and are within the scope of this disclosure.

Now referring to FIG. 10 (steps 1620-1630 of FIG. 16), a cross-section through electronic package 900 is shown after a semiconductor device 300 has been provided, the semiconductor device has been mounted to leadframe 905 and electronic package 900 has been encapsulated, as described above and discussed in more detail below.

In step 1625 of FIG. 16, semiconductor device 300 is mounted to top surface 915 of leadframe 905 with plurality of interconnects 345. Plurality of interconnects 345 may be disposed between semiconductor device 300 and leadframe 905 and configured to provide electrical continuity between the semiconductor device and portions of the leadframe. Semiconductor device 300, plurality of interconnects 345 and the method of mounting the semiconductor device may be similar as discussed above and described in FIGS. 2A and 7C.

Figure 10:
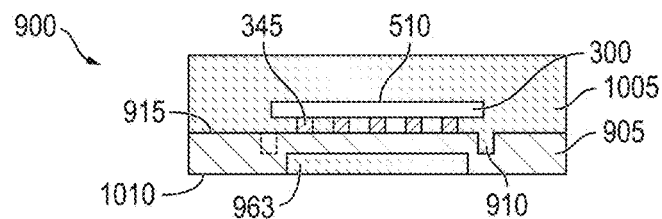
FIG. 10 is simplified cross-sectional view of a partially completed electronic package according to an embodiment of the invention.

Continuing to refer to FIG. 10 and advancing to step 1630 in FIG. 16, semiconductor device 300 and first and second patterns 910, 963, respectively in leadframe 905 are encapsulated with encapsulant material 1005. Encapsulant material 1005 has a thickness that extends from a bottom surface 1010 of leadframe 905 to at least top surface 510 of semiconductor device 300 such that the active areas of the semiconductor device may be protected from the environment. Encapsulant material 1005 also extends into first pattern 910 and second pattern 963 in leadframe 905 creating a substantially solid electronic package with few or no air voids. Encapsulant material 1005 may be similar to the encapsulant material discussed above in FIGS. 5A-7C.

Figure 11:
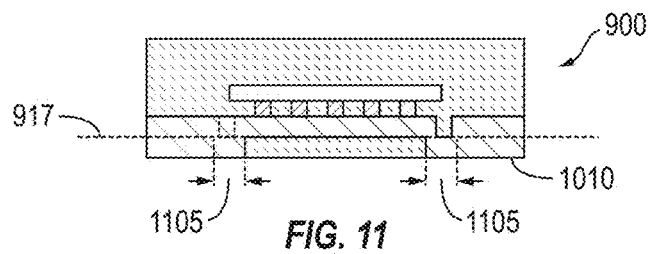
FIG. 11 is simplified cross-sectional view of a partially completed electronic package according to an embodiment of the invention.

Now referring to FIG. 11 two indicated regions 1105 are shown on electronic package 900 where one or more longitudinal channels may be formed in bottom surface 1010 of leadframe 905 to a depth of at least intermediate plane 917, as discussed in more detail below.

Figure 12:
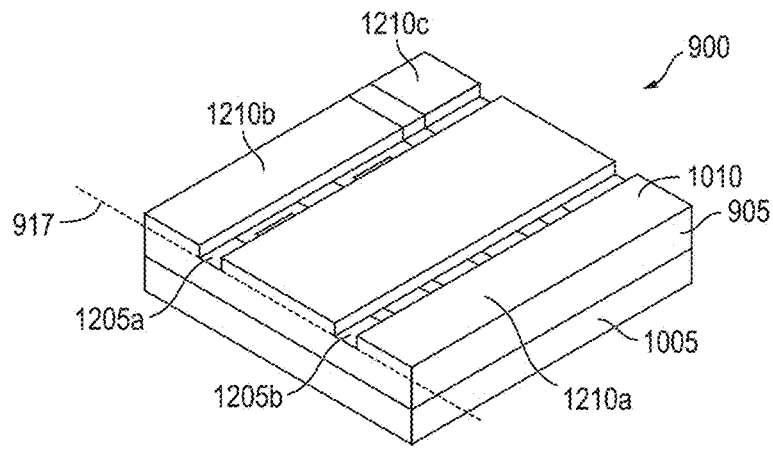
FIG. 12 is simplified cross-sectional view of a partially completed electronic package according to an embodiment of the invention.

Now referring to FIG. 12 (step 1635 in FIG. 16), an isometric view of the bottom of electronic package 900 is shown where longitudinal channels 1205a, 1205b have been formed in bottom surface 1010 of leadframe 905. In some embodiments a depth of longitudinal channels 1205a, 1205b shall be of sufficient depth and width to decouple (i.e., electrically isolate) first terminal fingers 935 from second terminal 925 and second terminal fingers 945 from first terminal 920. In one embodiment longitudinal channels 1205a, 1205b may be formed in bottom surface 1010 of leadframe 905 to a depth of approximately one half the thickness of the leadframe or intermediate plane 917, while in further embodiments the longitudinal channels may be formed deeper than the intermediate plane. In some embodiments longitudinal channels 1205a, 1205b may be formed by a process of sawing partially through electronic package 900, while in other embodiments they may be formed by other processes such as, but not limited to chemical etching as shown in more detail in FIGS. 13 and 14. Similar to electronic package 100 in FIG. 1, electronic package 900 may have one or more terminals 1210a, 1210b, 1210c that enable the electronic package to be attached to a printed circuit board or other electronic assembly.

In one embodiment one or more terminals 1210a, 1210b, 1210c may be called "exterior portions" of respective terminals 920, 925 and 930. In some embodiments an exterior "creepage" distance between one or more terminals 1210a, 1210b, 1210c may be greater than 1 millimeter and in further embodiments may be between 2 to 3 millimeters.

Figure 13:
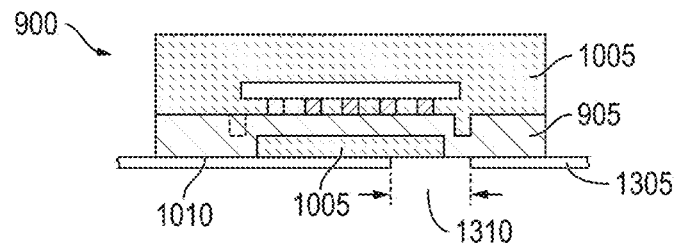
FIGS. 13-14 are simplified cross-sectional views of a method of forming one or more channels in the partially completed electronic package illustrated in FIG. 12.
Figure 14:
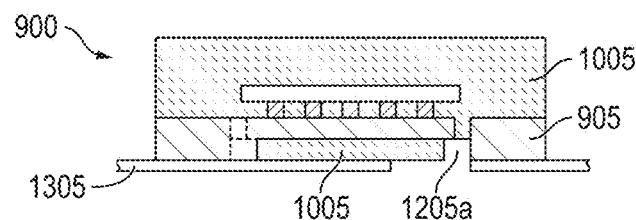

Now referring to FIGS. 13 and 14, one embodiment of a chemical etching process is employed to form a longitudinal channel 1205a (see FIG. 12) in leadframe 905. In one embodiment an etching mask 1305 may be placed on bottom surface 1010 of leadframe 905. An aperture 1310 in etching mask 1305 may be aligned over an appropriate area of leadframe 905 to allow a chemical etchant to remove a portion of the leadframe. In one embodiment aperture 1310 may be substantially larger than an area of leadframe 905 to be removed allowing an increased flow of etchant and faster formation of channel 1205a. In such embodiments, encapsulant 1005 may be used to act as one edge of etching mask 1305, forming one edge of channel 1205a, and mask aperture 1310 may be used to form the opposite edge of the channel. Such embodiments having an enlarged mask aperture may also benefit by reducing the required alignment tolerances for mask 1305 on package 900 as encapsulant 1005 acts as one edge of etching mask 1305.

Now referring to FIG. 14, a portion of leadframe 905 has been removed forming longitudinal channel 1205*a*. Mask 1305 may now be removed. A similar process may be used to form additional channels in leadframe 905 such as channel 1205*b* shown in FIG. 12.

Figure 15:
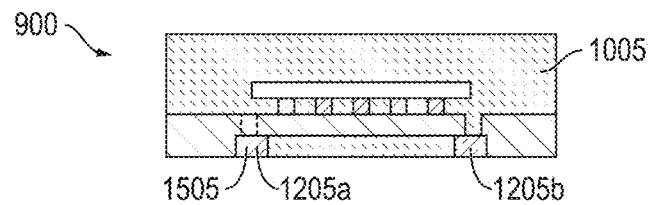
FIG. 15 is a simplified cross-sectional view of the partially completed electronic package illustrated in FIG. 12 with an encapsulant deposited in the two channels.
Figure 16:
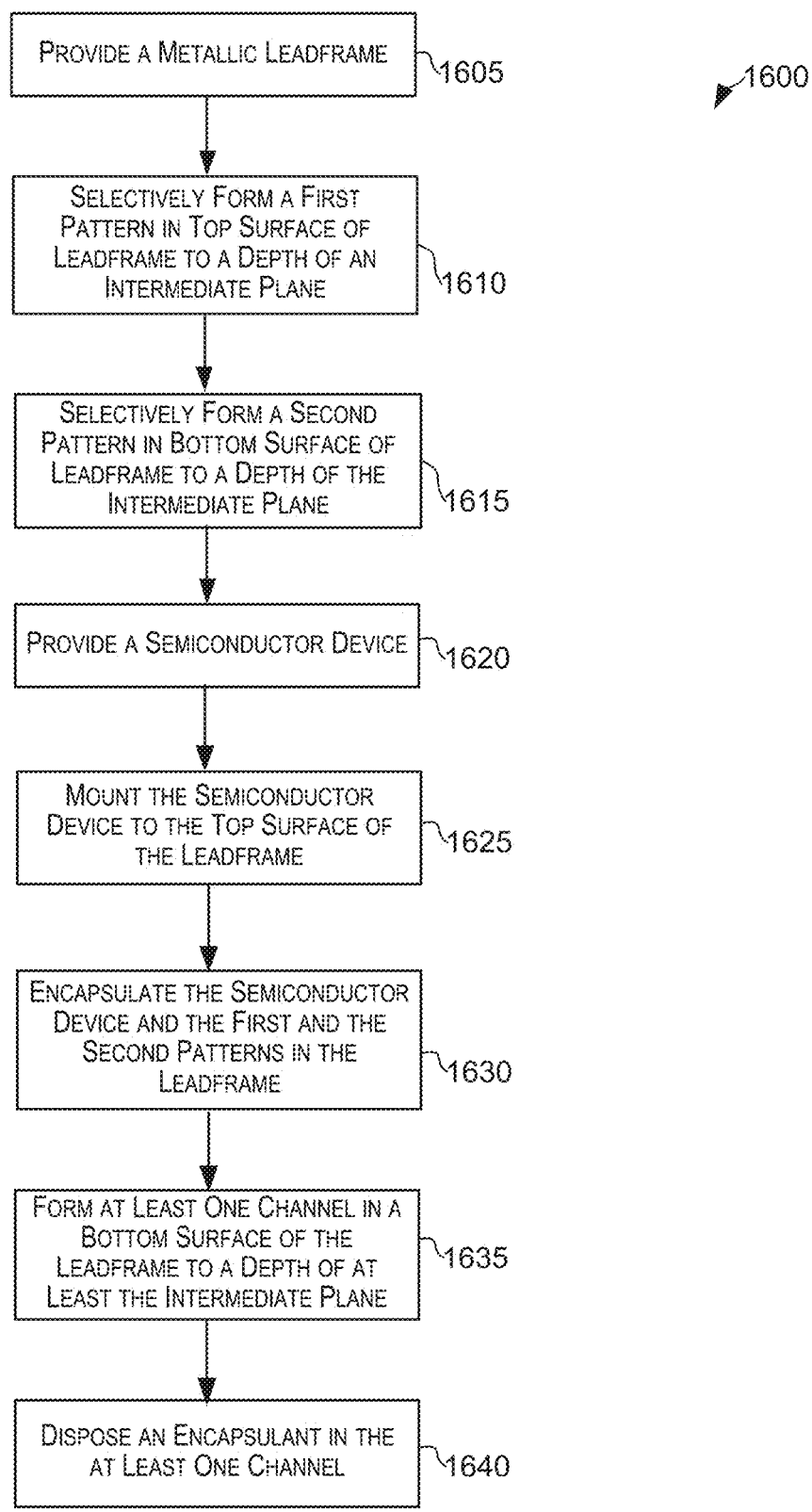
FIG. 16 is method of manufacturing the electronic package illustrated in FIGS. 9-15.

Now referring to FIG. 15 (step 1640, FIG. 16), a second encapsulant 1505 is disposed within longitudinal channels 1205*a*, 1205*b*. Second encapsulant 1505 may be the same as first encapsulant 1005, discussed above, or it may be a different material. The term "second encapsulant" is only used herein to distinguish it from the encapsulant that was initially used to encapsulate semiconductor device 300. In one embodiment second encapsulant 1505 is formed by performing a second transfer molding operation. In another embodiment second encapsulant 1505 may be a dispensable material and is dispensed within channels 1205*a*, 1205*b*. In further embodiments other techniques may be used to dispose second encapsulant 1505 within channels 1205*a*, 1205*b*. Second encapsulant 1505 may provide increased dielectric withstanding voltage between first terminal fingers 935 (see FIG. 9), second terminal fingers 945 and gate finger 960. In further embodiments second encapsulant 1505 may be disposed within channels 1205*a*, 1205*b* such that it extends from intermediate plane 917 to bottom 1010 of electronic package 900, while in other embodiments the second encapsulant may not extend to the bottom of the electronic package.

Now referring to FIGS. 17A-18B another embodiment of an electronic package 1700 is illustrated. Electronic package 1700 may also be attached to a printed circuit board 110 (as illustrated in FIG. 1) with one or more leads and may be made with a similar process as electronic package 100 illustrated in FIGS. 2A-5B, however, instead of a bottom portion of the leadframe being removed and a dielectric layer disposed on the bottom of the electronic package, in this embodiment a longitudinal channel is formed in a bottom surface of the leadframe and an encapsulant is disposed within the channel, as discussed in more detail below.

Figure 17A:
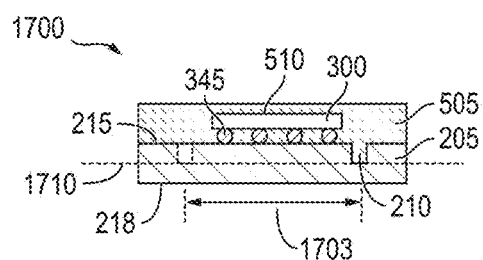
FIG. 17A is a simplified cross-section a partially assembled electronic package according to an embodiment of the invention.

Now referring to FIG. 17A, electronic package 1700 has been manufactured using the same process as electronic package 100 illustrated in FIGS. 2A-5B and method of manufacturing process steps 805 through 825 illustrated in FIG. 8. Thus, FIG. 17A is identical to cross-section C-C illustrated in FIG. 5B, however FIG. 17A illustrates region 1703 where a second pattern comprising a longitudinal channel will be formed in bottom surface 218 of leadframe 205, as discussed in more detail below.

Figure 17B:
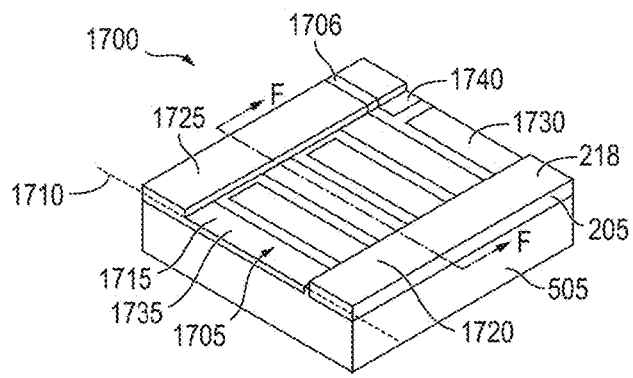
FIGS. 17B-17C are simplified illustrations of the partially assembled electronic package in FIG. 17A with a channel disposed in a bottom surface.
Figure 17C:
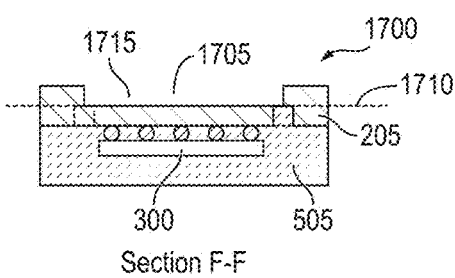

Now referring to FIG. 17B second pattern 1705 may be selectively formed in bottom surface 218 of leadframe 205 to a depth of an intermediate plane 1710. In some embodiments intermediate plane 1710 may be disposed at any location between top surface 215 and bottom surface 218 of leadframe 205, however in one embodiment the intermediate plane is disposed approximately at the midpoint between the top surface and the bottom surface. In some embodiments second pattern 1705 may form one relatively broad longitudinal channel 1715 in bottom surface 218, however in other embodiments a transverse channel 1706 may also be formed. FIG. 17C shows section F-F from FIG. 17B, which is a cross-section through a selected portion of leadframe 205, encapsulant 505 and semiconductor device 300.

In one embodiment channel 1715 may be formed between first terminal 1720 and second terminal 1725, such that a thickness of a plurality of first terminal fingers 1730, a thickness of plurality of second terminal fingers 1735 and a thickness of at least one third terminal finger 1740 are reduced to a thickness of approximately one half the thickness of leadframe 205, which in this embodiment is the same as intermediate plane 1710. In further embodiments, a width of longitudinal channel 1715 may be wide enough to sever connections between distal ends of plurality of first terminal fingers 1730 and plurality of second terminal fingers 1735 fingers from first terminal 1720 and second terminal 1725. More specifically, in some embodiments the depth and width of longitudinal channel 1715 shall be sufficient to decouple (i.e., electrically isolate) plurality of first terminal fingers 1730 from second terminal 1725 and plurality of second terminal fingers 1735 from first terminal 1720. Similarly, at least one third terminal finger 1740 may be electrically isolated from plurality of first terminal fingers 1730. Longitudinal channel 1715 may be formed with any of the processes discussed above, including etching or sawing. Since encapsulant 505 is in place holding plurality of first terminal fingers 1730 and plurality of second terminal fingers 1735 fingers in place, the leadframe connections that held the fingers in place during prior processing may be severed by longitudinal channel 1715.

In some embodiments transverse channel 1706 may be formed similarly to longitudinal channel 1715. Transverse channel 1706 may sever third terminal finger 1740 from second terminal 1725

Figure 18A:
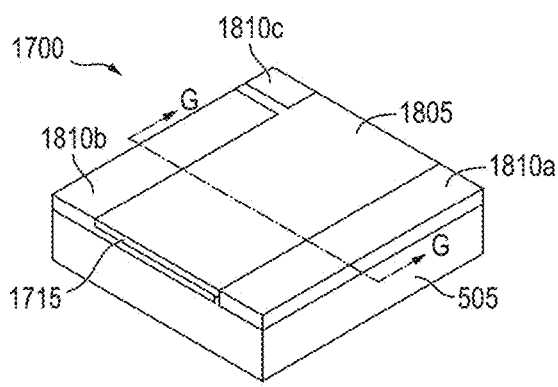
FIGS. 18A-18B are simplified illustrations of a the partially assembled electronic package in FIGS. 17B-17C with an encapsulant disposed in the channel.

Now referring to FIG. 18A a second encapsulant 1805 is disposed within longitudinal channel 1715 and transverse channel 1706. Similar to electronic package 100 in FIG. 1, electronic package 1700 may have one or more terminals 1810*a*, 1810*b*, 1810*c* that enable the electronic package to be attached to a printed circuit board or other electronic assembly.

Figure 18B:
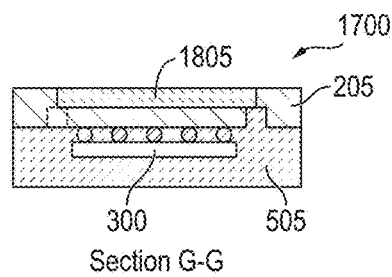

FIG. 18B shows section G-G from FIG. 18A which is a cross-section through a selected portion of leadframe 205, encapsulant 505 and semiconductor device 300. Second encapsulant 1805 may be the same material and deposited in the same manner as encapsulant 505, as discussed above in more detail with regard to FIG. 15. Second encapsulant 1805 may provide increased dielectric withstanding voltage between first terminal fingers 1730 (see FIG. 17B), second terminal fingers 1735 and at least one third terminal finger 1740.

In another embodiment electronic package 1700 illustrated in FIG. 17A may be manufactured using the same process as electronic package 900 illustrated in FIGS. 9-15 and method of manufacturing process steps 1605 through 1640 illustrated in FIG. 16. Thus, a first and a second pattern may be formed in the top and the bottom side, respectively, of leadframe 205. A first molding operation may be performed, followed by the formation of one or more channels 1715, 1706 in the bottom surface followed by a secondary molding operation, as discussed in detail above. Other embodiments may use different processes than described above.

Figure 19:
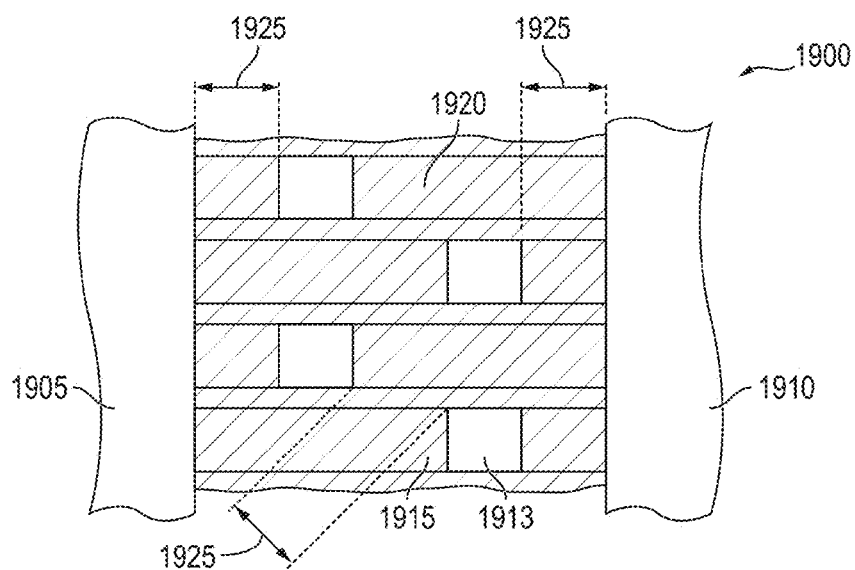
FIG. 19 is a simplified illustration of a portion of an electronic package for a GaN-based device according to an embodiment of the invention.

Now referring to FIG. 19 a view of a bottom portion of an electronic package 1900 is illustrated. Electronic package 1900 may be similar to electronic package 100 illustrated in FIG. 1 having one or more GaN-based semiconductor devices within it, however electronic package 1900 may only employ a single molding process while maintaining adequate creepage and clearance distance between source terminal 1905 and drain terminal 1910. Electronic package 1900 may use one or more pedestals 1913 judiciously disposed along source fingers 1915 and drain fingers 1920 to provide support to the fingers during die attach and molding operations. The judicious location of pedestals 1913 may provide the required spacing to meet creepage and clearance performance.

More specifically, electronic package 1900 may have a source terminal 1905 and a drain terminal 1910 that may be generally shaped as elongated pads, each having a plurality of fingers attached along a length of either pad and extending outwardly. Plurality of source fingers 1915 may each have a support pedestal 1913 that extends to a bottom surface of the electronic package to support the source fingers during die attach and molding operations. Plurality of drain fingers 1920 may each have a support pedestal 1913 that performs a similar function. Support pedestals 1913 may be located such that a distance 1925 between any portion of the leadframe that is at a different potential is a minimum distance to support creepage and clearance requirements for a particular application. In one embodiment distance 1925 is between 0.5 millimeters and 3 millimeters while in another embodiment it is between 1 millimeters and 2 millimeters and in one embodiment it is greater than 1 millimeter.

Figure 20:
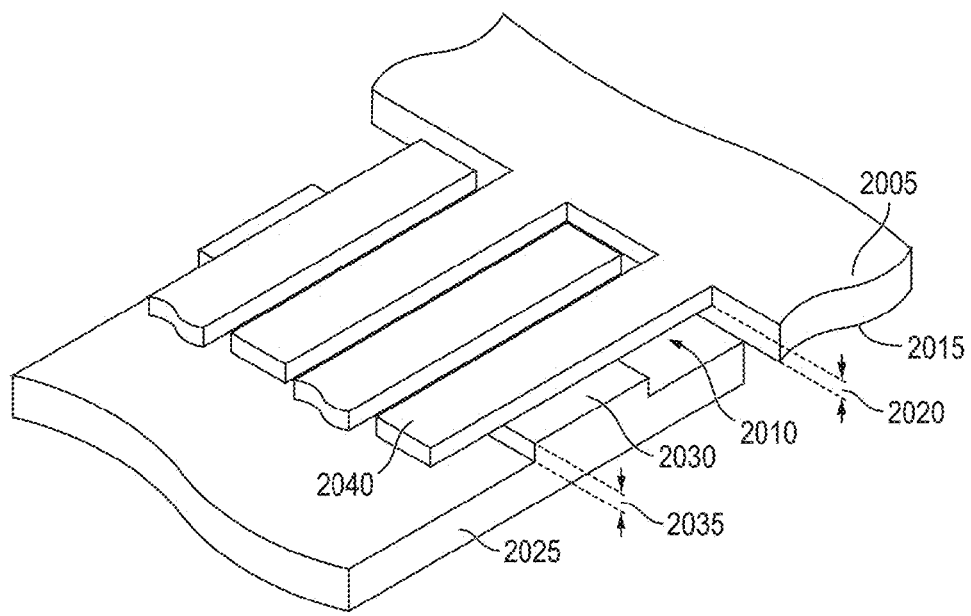
FIG. 20 is a simplified isometric illustration of a portion of a leadframe for an electronic package and an assembly fixture to hold the leadframe during assembly according to an embodiment of the invention.

Now referring to FIG. 20, another embodiment of a leadframe may be used in conjunction with an assembly fixture to provide support to leadframe fingers during die attach operations. In this embodiment leadframe 2005 may have a channel 2010 in bottom surface 2015 that has a depth of 2020. A tool 2025 has a pedestal 2030 of matching height 3035 that supports plurality of leads 2040 while a die is mounted to the plurality of leads. Leadframe 2005 and die assembly may then be cleaned and/or encapsulated as discussed above. In this embodiment the semiconductor device attached to plurality of leads 2040 may hold the plurality of leads in place during the cleaning and/or encapsulation process.

Now referring to FIGS. 21-25, myriad embodiments describing encapsulation and heat sinking methods for electronic packages are illustrated. More specifically, any of the embodiments in FIGS. 21-25 may be employed in any of the embodiments described within this disclosure.

Figure 21:
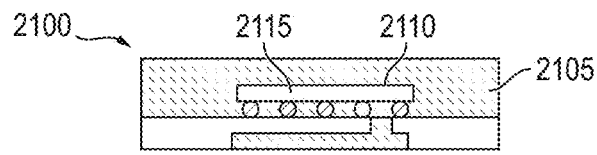
FIG. 21 is a simplified cross-section of an electronic package configuration according to an embodiment of the invention.

Now referring to FIG. 21 a cross-section of an electronic package 2100 is illustrated. Electronic package 2100 has a first encapsulation layer 2105 that extends above a top surface 2110 of semiconductor device 2115.

Figure 22:
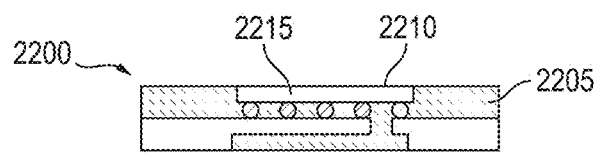
FIG. 22 is a simplified cross-section of an electronic package configuration according to an embodiment of the invention.

Now referring to FIG. 22 a cross-section of an electronic package 2200 is illustrated. Electronic package 2200 has a first encapsulation layer 2205 that extends to a top surface 2210 of semiconductor device 2215.

Figure 23:
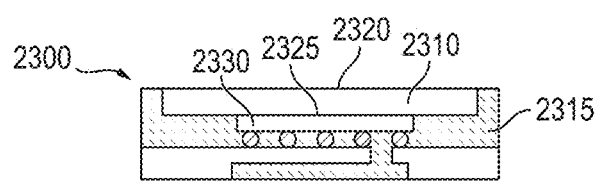
FIG. 23 is a simplified cross-section of an electronic package configuration according to an embodiment of the invention.

Now referring to FIG. 23 a cross-section of an electronic package 2300 is illustrated. Electronic package 2300 has an integrated heat spreader 2310 and a first encapsulation layer 2315 that extends to a top surface 2320 of the heat spreader. Heat spreader 2310 may be attached to a top surface 2325 of semiconductor device 2330 and assist in reducing the thermal power density of the semiconductor device to more efficiently dissipate thermal energy to the surrounding air and/or to an attached heatsink. In some embodiments heat spreader 2310 may be made from a metal or a ceramic such as, but not limited to, copper, steel, aluminum, aluminum oxide, aluminum nitride and beryllium oxide. In further embodiments heat spreader 2310 may extend across an entire top surface of electronic package 2300.

Figure 24:
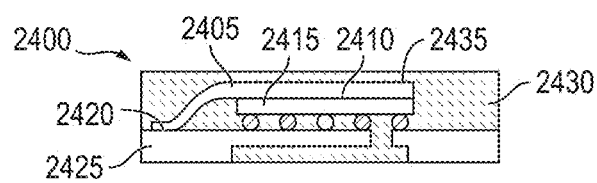
FIG. 24 is a simplified cross-section of an electronic package configuration according to an embodiment of the invention.

Now referring to FIG. 24 a cross-section of an electronic package 2400 is illustrated. Electronic package 2400 may have an integrated strap 2405 that may act as an internal heat spreader as discussed above with regard to FIG. 23 and may also act as an electrical conductor in various embodiments. Integrated strap 2405 may be secured to a top surface 2410 of semiconductor device 2415 and may be coupled to top surface 2420 of leadframe 2425 Electronic package 2400 may have a first encapsulation layer 2430 that extends above a top surface 2435 of integrated strap 2405. In some embodiments integrated strap 2405 may comprise metal, such as but not limited to, copper, brass, aluminum or steel.

Figure 25:
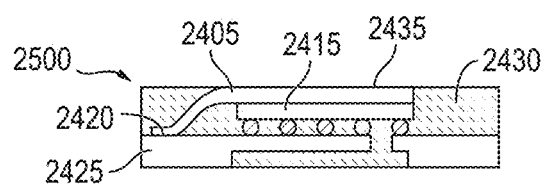
FIG. 25 is a simplified cross-section of an electronic package configuration according to an embodiment of the invention.

Now referring to FIG. 25, electronic package 2500 may be similar to electronic package 2400 illustrated in FIG. 24, except that encapsulation layer 2430 may only extend to top surface 2435 of integrated strap 2405. This may enable integrated strap 2405 to more efficiently transfer thermal energy to the environment and/or to an attached heatsink.

Figure 26:
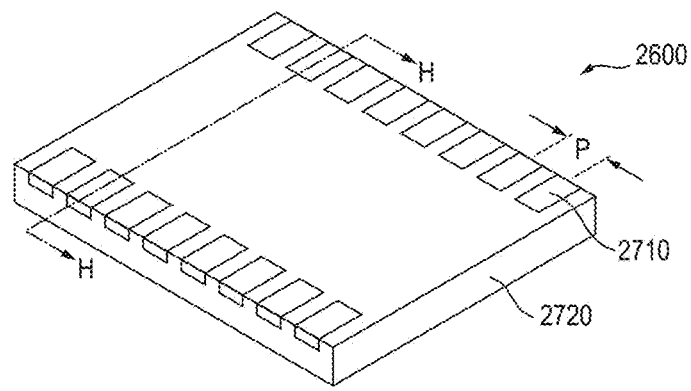
FIG. 26 is a simplified isometric illustration of an electronic package for a GaN-based device according to an embodiment of the invention.

Now referring to FIG. 26 another embodiment of an electronic package 2600 is illustrated. This embodiment is similar to the embodiments above, having one or more GaN-based semiconductor devices within it, however this embodiment has multiple source terminals and multiple drain terminals on the exterior of the electronic package, as described in more detail below.

Figure 27:
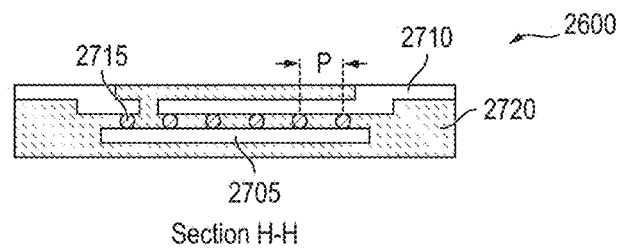
FIG. 27 is a simplified cross-section of the electronic package illustrated in FIG. 26.

Now referring to FIG. 27 a cross-section H-H through a portion of electronic package 2600 in FIG. 26 is illustrated. Electronic package 2600 may be made in a similar fashion as electronic packages 100 and 900 described above where leadframe 2710 is first formed, semiconductor device 2705 is attached to the leadframe and the assembly is encapsulated with encapsulation material 2720.

Figure 28:
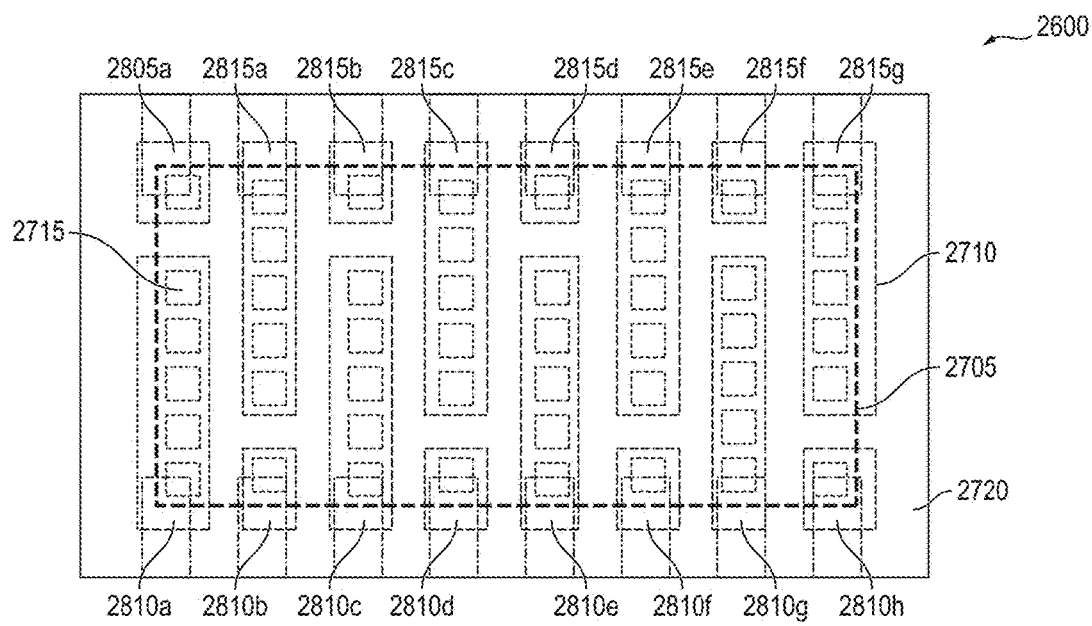
FIG. 28 is a simplified transparent view of the electronic package illustrated in FIG. 26.

Now referring to FIG. 28 a top view of electronic package 2600 is shown with semiconductor device 2705, leadframe 2710 and semiconductor die to leadframe interconnects 2715 illustrated with hidden lines.

In this embodiment, electronic package 2600 may have a plurality of fingers to which semiconductor device 2705 is attached. Each finger may have a lead disposed on exterior of electronic package, as described in more detail below. Thus, in embodiments where the semiconductor device is a transistor, electronic package 2600 may have a plurality of source and drain fingers and a plurality of source and drain leads. More specifically, in one embodiment lead 2805*a* may be a gate lead, leads 2810*a*-2810*h* may be source leads and leads 2815*a*-2815*g* may be drain leads. Other embodiments may have different lead, terminal and finger configurations such as, but not limited to, the electronic package depicted in FIG. 29.

In one embodiment, electronic package 2600 may have external dimensions in the range of 2 millimeters wide by 3.5 millimeters long. In yet further embodiments semiconductor device 2700 may have external dimensions in the range of 1.5 millimeters wide by 3 millimeters long resulting in a package that is approximately 52 percent larger than the semiconductor device and a footprint ration of approximately 0.66. In further embodiments a pitch between adjacent pad fingers on the semiconductor device and between matching fingers of the leadframe may be approximately 400 microns. In further embodiments a pitch between interconnect structures on the semiconductor device may be approximately 200 microns.

Figure 29:
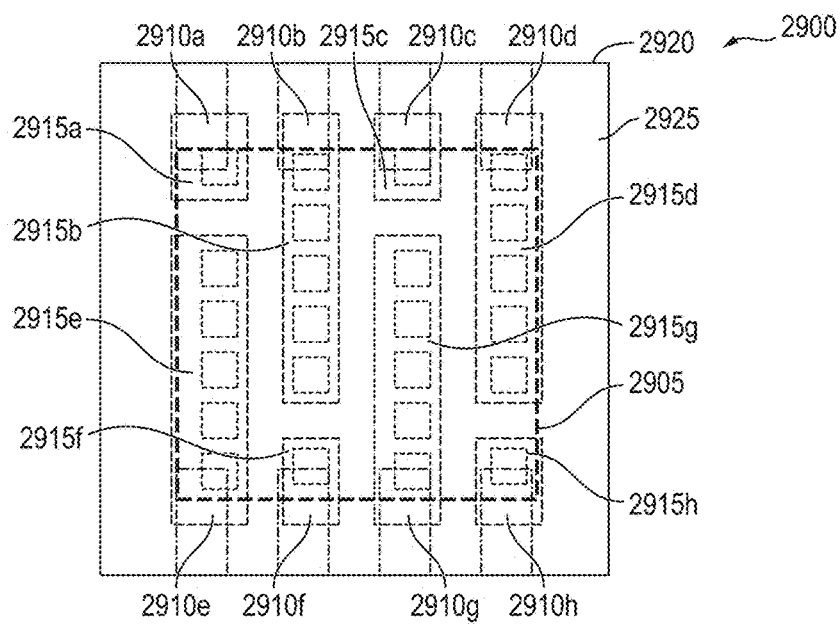
FIG. 29 is a simplified transparent view of an electronic package according to an embodiment of the invention.

Now referring to FIG. 29 an electronic package 2900 that is similar to electronic package 2600 is illustrated in plan view showing semiconductor die 2905, and a plurality of terminals 2910*a*-2910*h* each having a finger 2915*a*-2915*h* in hidden lines. Exterior edge 2920 of electronic package 2900 is defined by encapsulation material 2925 and may have exterior dimensions that are approximately 2 millimeters by 2 millimeters. Other embodiments may have different lead, terminal and finger configurations and are within the scope of this disclosure.

Figure 30:
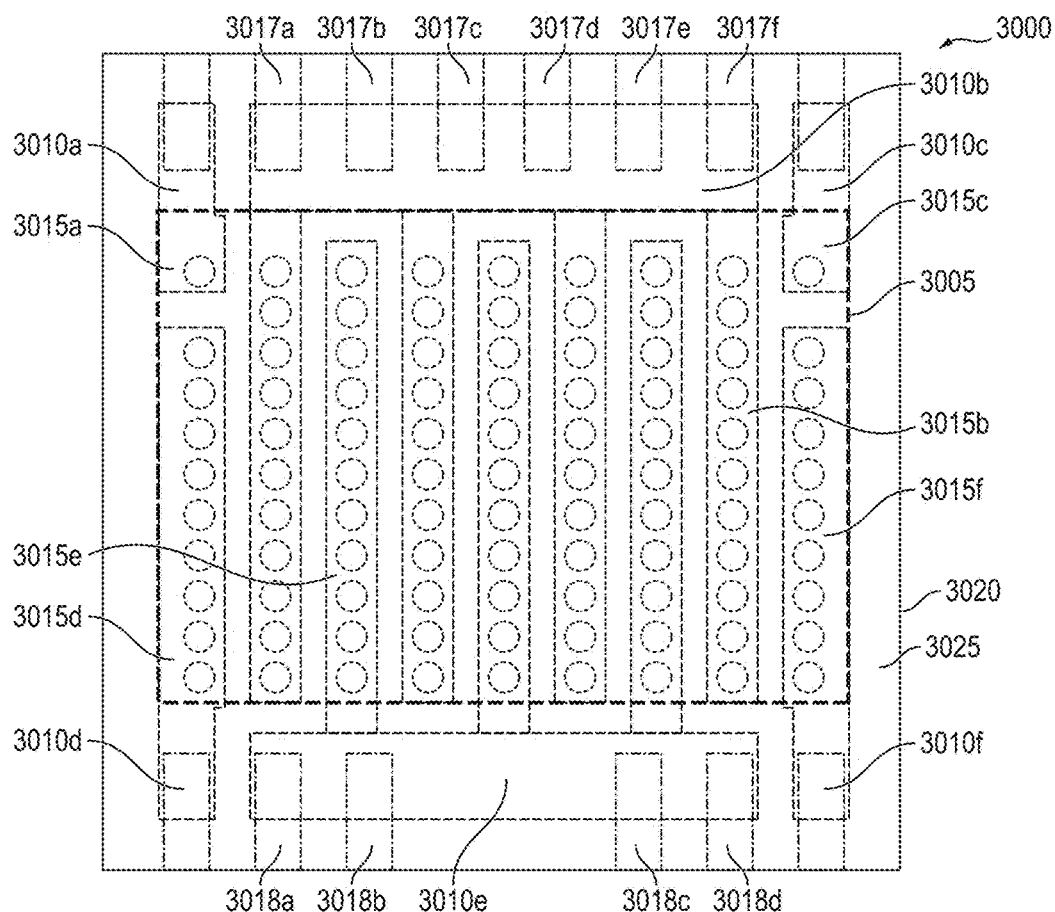
FIG. 30 is a simplified transparent view of an electronic package according to an embodiment of the invention.

Now referring to FIG. 30 an electronic package 3000 that is similar to electronic package 2900 is illustrated in plan view showing semiconductor die 3005, and a plurality of terminals 3010a-3010f. Terminals 3010a, 3010c, 3010d and 3010f each have single fingers 3015a, 3015c, 3015d and 3015f, respectively. However, terminals 3010b and 3010e each have a plurality of fingers 3015b and 3015e, respectively. In some embodiments fingers 3015a-3015f may be longer than 1 millimeter. Further, terminal 3010b may have a plurality of leads 3017a-3017f and terminal 3010e may have a plurality of leads 3018a-3018d that are on an exterior surface of electronic package 3000. Exterior edge 3020 of electronic package 3000 is defined by encapsulation material 3025. Other embodiments may have different lead, terminal and finger configurations and are within the scope of this disclosure.

Figure 31:
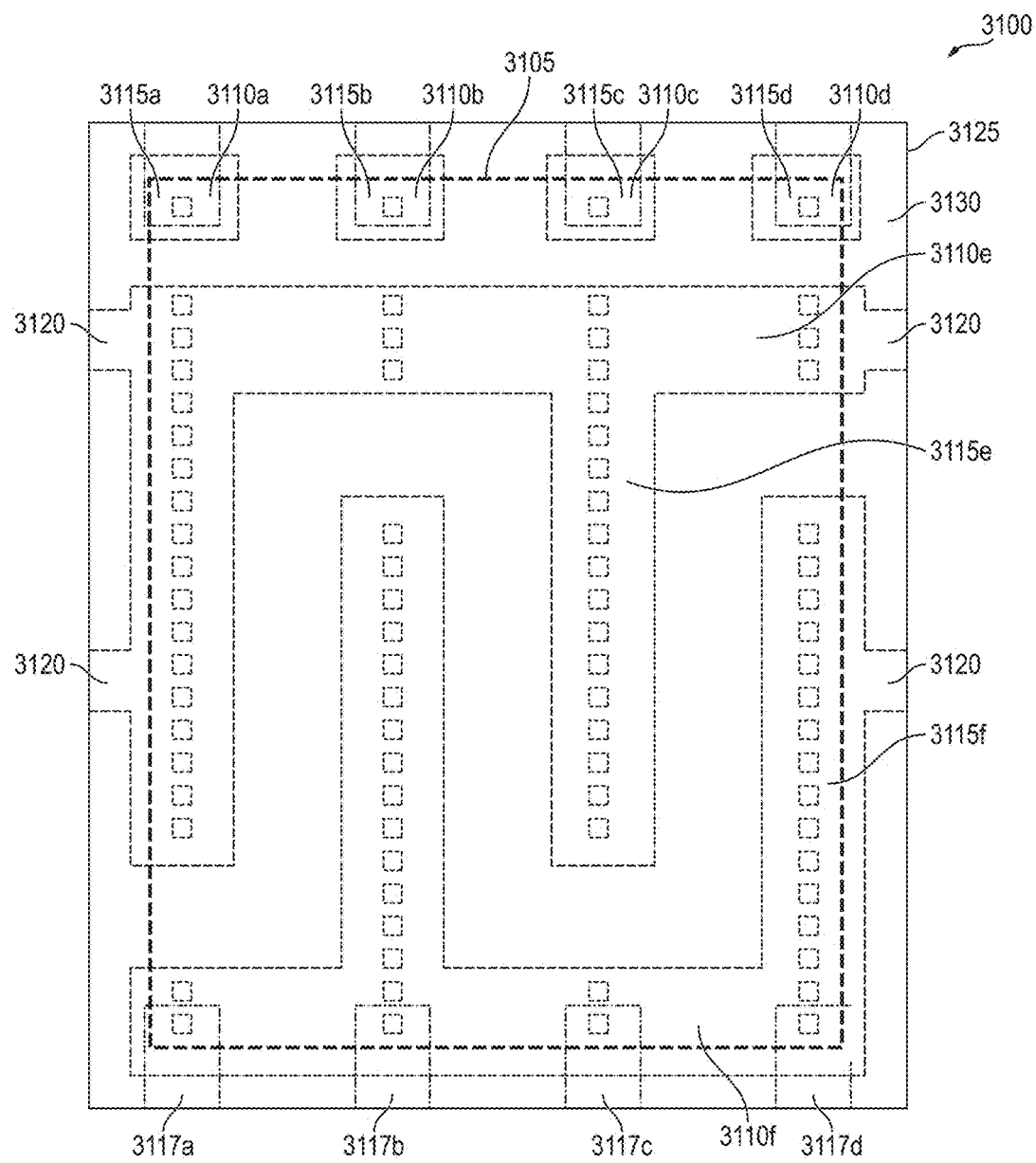
FIG. 31 is a simplified transparent view of an electronic package according to an embodiment of the invention.

Now referring to FIG. 31 an electronic package 3100 that is similar to electronic package 3000 is illustrated in plan view showing semiconductor die 3105, and a plurality of terminals 3110a-3110f In some embodiments, electronic package 3100 may be used at a relatively low voltage such as up to 100 Volts and in some cases up to 200 Volts due to the closer spacing and fully exposed leads on a bottom surface of the electronic package. In further embodiments electronic package 3100 may be approximately 6 millimeters wide by 6.5 millimeters long. Terminals 3110a-3110d may each have single fingers 3115a-3115d, respectively that also act as leads exposed on the bottom of the electronic package. In one embodiment terminals 3110a-3110d may be used as gate connections, gate drive power supply connections or other circuit functions. In further embodiments, terminals 3110e and 3110f each have a plurality of fingers 3115e and 3115f, respectively and may be used for source and drain connections.

Further, in some embodiments terminal 3110f may have a plurality of leads 3117a-3117d that are exposed on the bottom of the electronic package. In this embodiment terminals 3110e and 3110f may be relatively large leads exposed on the bottom of the electronic package. In some embodiments portions of the leads exposed on the bottom of the package may be recessed so they do not protrude from the bottom of the package. In other embodiments one or more tiebars 3120 may be used to hold terminal 3110e and one or more of fingers 3115e and 3115f to an outer frame of a leadframe assembly so they remain in position during processing. Exterior edge 3125 of electronic package 3100 is defined by encapsulation material 3130. Other embodiments may have different lead, terminal and finger configurations and are within the scope of this disclosure.

Figure 32:
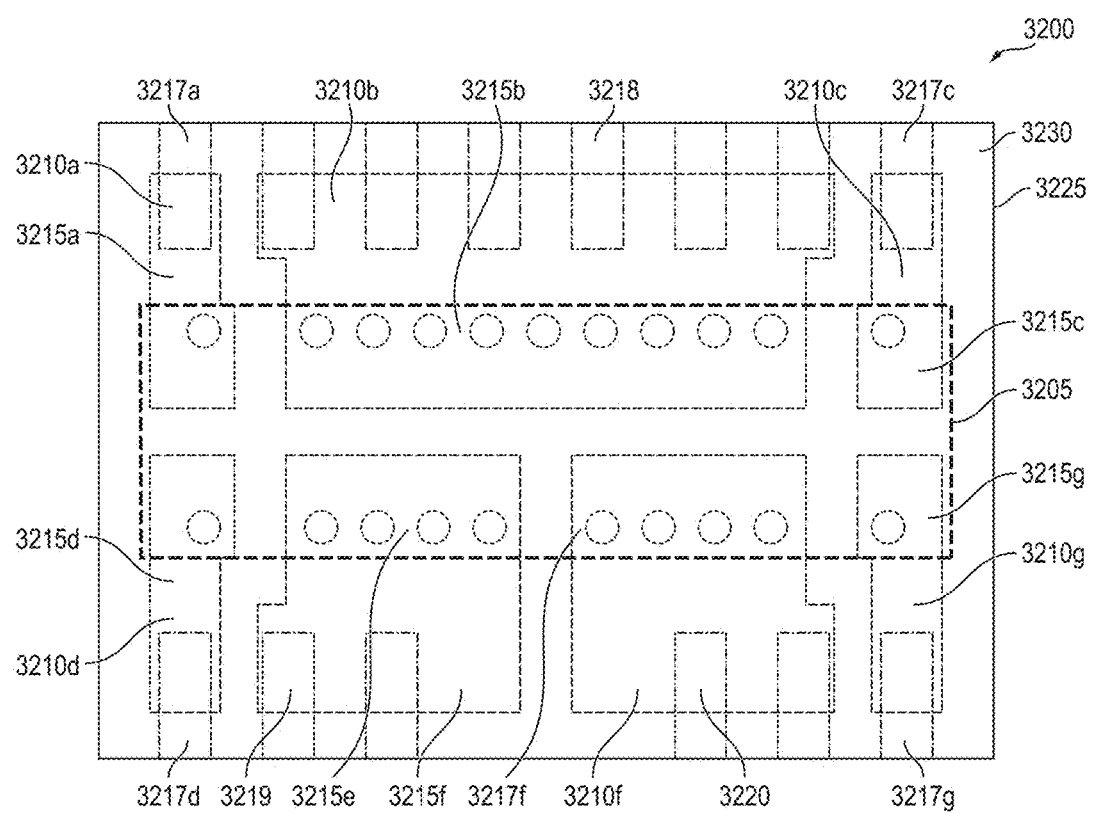
FIG. 32 is a simplified transparent view of an electronic package according to an embodiment of the invention.

Now referring to FIG. 32 an electronic package 3200 that is similar to electronic package 3100 is illustrated in plan view showing semiconductor die 3205, and a plurality of terminals 3210a-3210g. Terminals 3210a-3210g each have single fingers 3215a-3215g, respectively. Further, in one embodiment terminals 3210a, 3210c, 3210d and 3210g each have a single lead 3217a, 3217c, 3217d and 3217g, respectively and may be used for two independent gates and two independent source kelvin pins. Terminal 3210b may have a plurality of leads 3218, terminal 3210 may have a plurality of leads 3219 and terminal 3210f may have a plurality of leads 3220. Exterior edge 3225 of electronic package 3200 is defined by encapsulation material 3230. Other embodiments may have different lead, terminal and finger configurations. In some embodiments electronic package 3200 may be used for a bidirectional switch or two common source independent switches.

Figure 33:
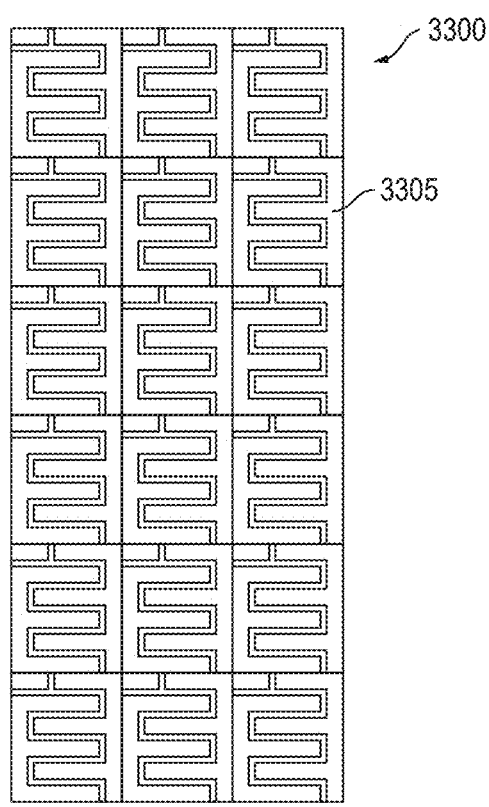
FIG. 33 is a simplified illustration of a plurality of electronic packages in a panel configuration according to an embodiment of the invention.

Now referring to FIG. 33, some embodiments of electronic packages described herein manufactured in a matrix configuration as shown by panel 3300. Panel 3300 may comprise a plurality of individual electronic packages 3305. In some embodiments each electronic package 3305 may have a leadframe that is a portion of a single leadframe for the entire panel. Thus, panel 3300 may proceed to each manufacturing step so at each step a plurality of electronic packages 3305 are simultaneously processed. At the end of the manufacturing process, panel 3300 may be singulated into individual electronic packages 3305. This process may be known in the art as processing "strips" or "matrices" of electronic packages. In some embodiments such processing techniques may allow a single channel such as channel 963 in FIGS. 9, 1205a and 1205b in FIGS. 12 and 1715 in FIG. 17B to be formed in a plurality of electronic packages 3305 with a single pass of a saw.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction. The specific details of particular embodiments may be combined in any suitable manner without departing from the spirit and scope of embodiments of the invention.

Additionally, spatially relative terms, such as "bottom or "top" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface may then be oriented "above" other elements or features. The device may be otherwise oriented (e.g., rotated 90 degrees or at other orientations) and the spatially relative descriptors used herein interpreted accordingly.

What is claimed is:

1. An electronic package comprising:
    a leadframe having a thickness extending from a top surface of the leadframe to a bottom surface of the leadframe and comprising:
        a first terminal having a plurality of first terminal fingers extending therefrom and a second terminal having a plurality of second terminal fingers extending therefrom wherein the plurality of first terminal fingers are interdigitated with the plurality of second terminal fingers;
        a third terminal having at least one third terminal finger;
        wherein the first terminal, the second terminal and the third terminal have a first thickness extending from the top surface of the leadframe to the bottom surface of the leadframe; and
        wherein the first terminal fingers, the second terminal fingers and the at least one third terminal finger have a second thickness extending from the top surface of the leadframe to an intermediate plane that is located between the top surface and the bottom surface of the leadframe;
    a GaN-based die electrically coupled to the top surface of the leadframe, and including a source pad having a plurality of source fingers and a drain pad having a plurality of drain fingers wherein the plurality of source fingers are interdigitated with the plurality of drain fingers, and a gate pad;

a plurality of interconnects disposed between the GaN-based die and the top surface of the leadframe and configured to provide electrical continuity between the plurality of first terminal fingers and the plurality of drain fingers, between the plurality of second terminal fingers and the plurality of source fingers and between the third terminal finger and the at least one gate pad, respectively;

a first encapsulant adhered to the leadframe such that it encapsulates the GaN-based die, the first encapsulant having a thickness that extends from at least the intermediate plane to at least a top surface of the GaN-based die;

one or more channels formed in the bottom surface of the leadframe to a depth of at least the intermediate plane;

a second encapsulant disposed within the one or more channels.

2. The electronic package of claim 1 wherein there are two channels formed in the bottom surface of the leadframe.

3. The electronic package of claim 1 wherein portions of the first encapsulant extend to the bottom surface of the leadframe.

4. The electronic package of claim 1 wherein the first terminal is an elongated bar and the plurality of first terminal fingers are attached along a length of the bar and extend outward away from the first terminal in a direction of the second terminal.

5. The electronic package of claim 1 wherein an exposed portion of the first terminal is separated from an exposed portion of the second terminal by a distance of at least 1 millimeter.

6. The electronic package of claim 1 wherein a heat spreader is attached to a top surface of the GaN-based die.

7. The electronic package of claim 6 wherein the heat spreader extends to a top surface of the electronic package.

8. The electronic package of claim 1 wherein a strap is secured to a top surface of the GaN-based die and to the top surface of the leadframe.

9. The electronic package of claim 1 wherein the leadframe has a thickness that is between 50 microns and 250 microns thick.

10. The electronic package of claim 1 wherein a length of the first and the second terminal fingers is greater than a pitch between each of the first terminal fingers and each of the second terminal fingers.

11. A method of forming an electronic package, the method comprising:

providing a metallic leadframe having a thickness extending from a top surface of the leadframe to a bottom surface of the leadframe;

selectively forming a first pattern in the top surface of the leadframe to an intermediate plane having a depth of approximately one half the thickness of the leadframe;

selectively forming a second pattern in the bottom surface of the leadframe to a depth of the intermediate plane;

providing a semiconductor device having a plurality of pads;

mounting the semiconductor device to the top surface of the leadframe using a plurality of electrical interconnects;

forming a first encapsulant around the semiconductor device and within the first and the second patterns;

forming at least one channel in the bottom surface of the leadframe to a depth of at least the intermediate plane; and disposing a second encapsulant within the at least one channel.

12. The method of claim 11 wherein the second encapsulant is the same material as the first encapsulant.

13. The method of claim 11 wherein the at least one channel is formed by chemically etching the leadframe material.

14. The method of claim 13 wherein the first encapsulant functions as at least one edge of an etching mask.

15. The method of claim 11 wherein the at least one channel is formed by sawing the leadframe material.

16. The method of claim 11 wherein a heat spreader is attached to a top surface of the GaN-based die before forming the first encapsulant.

17. The electronic package of claim 11 wherein a strap is secured to a top surface of the GaN-based die and to the top surface of the leadframe before forming the first encapsulant.

18. A method of forming an electronic package, the method comprising:

providing a metallic leadframe having a thickness extending from a top surface of the leadframe to a bottom surface of the leadframe;

selectively forming a first pattern in the top surface of the leadframe to an intermediate plane having a depth of approximately one half the thickness of the leadframe;

providing a semiconductor device having a plurality of pads;

mounting the semiconductor device to the top surface of the leadframe using a plurality of electrical interconnects;

forming a first encapsulant around the semiconductor device and within the first pattern;

removing at least a portion of the bottom surface of the leadframe to a depth of at least the intermediate plane; and disposing a dielectric material on a bottom surface of the electronic package.

19. The method of claim 18 wherein the removing at least a portion of the bottom surface of the leadframe comprises forming one or more channels in the bottom surface of the leadframe.

20. The method of claim 19 wherein disposing a dielectric material on a bottom surface of the leadframe comprises disposing an encapsulant material within the one or more channels.

21. The method of claim 18 wherein the removing at least a portion of the bottom surface of the leadframe comprises removing an entire bottom portion of the leadframe to the intermediate plane.

22. The method of claim 21 wherein the dielectric material comprises a dielectric layer disposed on a portion of a bottom surface of the electronic package such that the dielectric layer at least partially defining one or more electronic package interconnects.

23. The method of claim 18 wherein a heat spreader is attached to a top surface of the GaN-based die before forming the first encapsulant.

24. The method of claim 23 wherein the heat spreader extends to a top surface of the electronic package.

25. The electronic package of claim 18 wherein a strap is secured to a top surface of the GaN-based die and to the top surface of the leadframe before forming the first encapsulant.

26. An electronic package comprising:
a leadframe including a first terminal having a plurality of first terminal fingers extending therefrom and a second terminal having a plurality of second terminal fingers extending therefrom wherein the plurality of first terminal fingers are interdigitated with the plurality of second terminal fingers, and a third terminal having at least one third terminal finger; a GaN-based semiconductor device electrically coupled to a top surface of the leadframe and including a source pad having a plurality of source fingers and a drain pad having a plurality of drain fingers wherein the plurality of source fingers are interdigitated with the plurality of drain fingers, and a gate pad having at least one gate finger; a plurality of interconnects disposed between the GaN-based die and the leadframe and configured to provide electrical continuity between the plurality of first terminal fingers and the plurality of drain fingers, between the plurality of second terminal fingers and the plurality of source fingers and between the third terminal finger and the at least one gate finger, respectively; a dielectric layer disposed on a portion of a bottom surface of the electronic package at least partially defining one or more electronic package interconnects; and an encapsulant layer adhered to the leadframe and encapsulating the GaN-based die, the encapsulant layer having a thickness that extends from at least a top surface of the leadframe to at least a top surface of the GaN-based die;
wherein the first terminal, the second terminal and the third terminal have a first thickness extending from the to surface of the leadframe to a bottom surface of the leadframe; and
wherein the first terminal fingers, the second terminal fingers and the at least one third terminal finger have a second thickness extending from the top surface of the leadframe to an intermediate plane that is located between the top surface and the bottom surface of the leadframe.

27. The electronic package of claim 26 wherein the dielectric layer is a soldermask material.

28. The electronic package of claim 26 wherein the first terminal is an elongated bar and the plurality of first terminal fingers are attached along a length of the bar and extend outward away from the first terminal in a direction of the second terminal.

29. The electronic package of claim 26 wherein the second terminal is an elongated bar and the plurality of second terminal fingers are attached along a length of the bar and extend outward away from the second terminal in a direction of the first terminal.

30. The electronic package of claim 26 wherein the dielectric encapsulant extends to the bottom surface of the electronic package and is disposed within gaps between the plurality of first terminal fingers, the plurality of second terminal fingers and the third terminal finger.

31. The electronic package of claim 26 wherein the dielectric layer has a thickness between 50 microns and 150 microns.

32. The electronic package of claim 26 wherein the leadframe has a thickness that is between 50 microns and 250 microns thick.

33. The electronic package of claim 26 wherein the plurality of interconnects comprise solder.

34. The electronic package of claim 26 wherein the plurality of interconnects comprise copper-based structures secured to the top surface of the leadframe with a solder material.

35. The electronic package of claim 26 wherein the plurality of first terminal fingers and the plurality of the second terminal fingers have a pitch that is 800 microns or less.

36. The electronic package of claim 26 wherein the plurality of first terminal fingers and the plurality of the second terminal fingers have a length that is 1 millimeter or greater.

37. A method of forming an electronic package, the method comprising:
providing a metallic leadframe having a leadframe thickness extending between a top surface of the leadframe and a bottom surface of the leadframe;
selectively forming a first pattern in the top surface of the leadframe to a depth of an intermediate plane disposed between the top surface and the bottom surface of the leadframe;
selectively forming a second pattern in the bottom surface of the leadframe to a depth of the intermediate plane;
providing a semiconductor device having a plurality of pads; mounting the plurality of the pads of the semiconductor device to the top surface of the leadframe using a plurality of electrical interconnects;
encapsulating the semiconductor device and the top surface of the leadframe with an encapsulant;
forming at least one channel in the bottom surface of the leadframe to a depth of at least the intermediate plane;
disposing a second encapsulant within the at least one channel; and disposing a dielectric layer on a bottom surface of the electronic package.

38. The electronic package of claim 37 wherein the selective forming of the first pattern and the second pattern are performed with a chemical etching process.

39. The electronic package of claim 37 wherein the encapsulant is disposed within the first pattern to a depth of the intermediate plane.

* * * * *